(12) United States Patent
Fujii et al.

(10) Patent No.: US 8,394,457 B2
(45) Date of Patent: *Mar. 12, 2013

(54) PRECURSOR COMPOSITION FOR POROUS THIN FILM, METHOD FOR PREPARATION OF THE PRECURSOR COMPOSITION, POROUS THIN FILM, METHOD FOR PREPARATION OF THE POROUS THIN FILM, AND SEMICONDUCTOR DEVICE

(75) Inventors: Nobutoshi Fujii, Ibaraki (JP); Takahiro Nakayama, Ibaraki (JP); Kazuo Kohmura, Chiba (JP); Hirofumi Tanaka, Chiba (JP)

(73) Assignee: Ulvac, Inc., Chigasaki-shi (JP)

( * ) Notice: Subject to any disclaimer, the term of this patent is extended or adjusted under 35 U.S.C. 154(b) by 607 days.

This patent is subject to a terminal disclaimer.

(21) Appl. No.: 12/303,240

(22) PCT Filed: May 16, 2007

(86) PCT No.: PCT/JP2007/060027
§ 371 (c)(1),
(2), (4) Date: Jan. 15, 2009

(87) PCT Pub. No.: WO2007/142000
PCT Pub. Date: Dec. 13, 2007

(65) Prior Publication Data
US 2009/0186210 A1 Jul. 23, 2009

(30) Foreign Application Priority Data
Jun. 2, 2006 (JP) .................................. 2006-154846

(51) Int. Cl.
*B05D 3/02* (2006.01)
*C08J 7/06* (2006.01)
*B05D 3/06* (2006.01)

(52) U.S. Cl. ............ 427/255.6; 106/287.13; 106/287.16; 427/255.11; 427/387; 427/515; 524/236; 524/366; 524/404; 524/414; 524/434; 524/435; 524/437; 528/39

(58) Field of Classification Search ........................ None
See application file for complete search history.

(56) References Cited

U.S. PATENT DOCUMENTS

| | | | |
|---|---|---|---|
| 4,535,350 A | 8/1985 | Goodrich et al. | |
| 4,861,129 A | 8/1989 | Che et al. | |
| 5,858,541 A | 1/1999 | Hiraoka et al. | |
| 5,939,141 A | 8/1999 | Cagliostro | |
| 6,208,014 B1 | 3/2001 | Wu et al. | |
| 6,406,794 B1 | 6/2002 | Shiota et al. | |
| 6,472,079 B2 | 10/2002 | Hayashi et al. | |
| 6,576,344 B1 | 6/2003 | Doushita et al. | |
| 6,699,797 B1 | 3/2004 | Morris et al. | |
| 2001/0009936 A1* | 7/2001 | Suzuki et al. ................. 524/35 |
| 2002/0045693 A1* | 4/2002 | Hayashi et al. ............... 524/394 |
| 2002/0156180 A1* | 10/2002 | Yamada et al. ............... 524/588 |
| 2003/0099844 A1 | 5/2003 | Hanahata et al. | |
| 2003/0100644 A1* | 5/2003 | You et al. ..................... 524/300 |
| 2004/0087184 A1 | 5/2004 | Mandal et al. | |
| 2004/0180554 A1 | 9/2004 | Hamada et al. | |
| 2004/0188809 A1 | 9/2004 | Ogihara et al. | |
| 2004/0201007 A1 | 10/2004 | Yagihashi et al. | |
| 2004/0235971 A1 | 11/2004 | Hamada et al. | |
| 2005/0182227 A1* | 8/2005 | Morita et al. ..................... 528/18 |
| 2006/0292488 A1* | 12/2006 | Takayama et al. .......... 430/270.1 |
| 2007/0006776 A1 | 1/2007 | Oike et al. | |
| 2009/0053503 A1* | 2/2009 | Fujii et al. ................... 428/304.4 |

FOREIGN PATENT DOCUMENTS

| | | |
|---|---|---|
| CN | 1345464 A | 4/2002 |
| JP | 11-246665 A | 9/1999 |
| JP | 2000-038509 A | 2/2000 |
| JP | 2000-077399 A | 3/2000 |
| JP | 2001-226171 A | 8/2001 |
| JP | 2001-240673 A | 9/2001 |
| JP | 2001-287909 | * 10/2001 |
| JP | 2002-003784 A | 1/2002 |
| JP | 2002-9069 A | 1/2002 |
| JP | 2002-026003 A | 1/2002 |
| JP | 2002-164338 A | 6/2002 |
| JP | 2002-201415 A | 7/2002 |
| JP | 2002-252228 A | 9/2002 |
| JP | 2002-359240 A | 12/2002 |
| JP | 2003-183575 A | 7/2003 |
| JP | 2003-292890 A | 10/2003 |
| JP | 2003-306639 A | 10/2003 |
| JP | 2004-002579 A | 1/2004 |

(Continued)

OTHER PUBLICATIONS

Abstract for JP 2001-287909 (Oct. 2001).*
Abstract for WO 2004/105910 (Dec. 2004).*
Fishbein, Bruce J., "Characterization of cesium diffusion in silicon dioxide films using backscattering spectrometry." Applied Physics Letters , Apr. 27, 1987, vol. 50 (17), American Institute of Physics.
Hong Yang et al, "Synthesis of Oriented Films of Mesoporous Silica on Mica", Nature International Weekly Journal of Science, 1996, pp. 703-705, vol. 379.
Markoto Ogawa, "Preparation of Transparent Thin Films of Silica-Surfactant Mesostructured Materials", Supramolecular Science, 1998, pp. 247-251, vol. 5.
X.S. Zhao et al, "Comprehensive Study of Surface Chemistry of MCM-41 Using $^{29}$Si CP/MAS NMR, FTIR, Pyridine-TPD, and TGA", Journal of Physical Chemistry, 1997, pp. 6525-6531, vol. 101.

(Continued)

*Primary Examiner* — Marc Zimmer
(74) *Attorney, Agent, or Firm* — Arent Fox LLP

(57) ABSTRACT

Disclosed is a precursor composition comprising: a compound selected from a compound represented by the formula: $Si(OR^1)_4$ and a compound represented by the formula $R_a(Si)(OR^2)_{4-a}$ (in the formulas $R^1$ represents a monovalent organic group; R represents a hydrogen atom, a fluorine atom or a monovalent organic group; $R^2$ represents a monovalent organic group; and a is an integer ranging from 1 to 3, provided that R, $R^1$ and $R^2$ may be the same or different from one another) a thermally degradable organic compound; an element having a catalyst activity; urea; and the like. A porous thin film produced from the precursor composition is irradiated with ultraviolet ray, and then subjected to gas-phase reaction with a hydrophobic compound. A porous thin film thus prepared can be used for the manufacture of a semiconductor device.

6 Claims, 6 Drawing Sheets

| | FOREIGN PATENT DOCUMENTS | | |
|---|---|---|---|
| JP | 2004-051899 A | 2/2004 |
| JP | 2004-165401 A | 6/2004 |
| JP | 2004-274052 A | 9/2004 |
| JP | 2004-292304 A | 10/2004 |
| JP | 2004-292639 A | 10/2004 |
| JP | 2005-166716 A | 6/2005 |
| JP | 2005-272188 A | 10/2005 |
| WO | WO 91/11390 A2 | 8/1991 |
| WO | WO 99/03926 A1 | 1/1999 |
| WO | WO-00/44036 A1 | 7/2000 |
| WO | WO-2004/094311 A1 | 11/2004 |
| WO | WO 2004/105910 | * | 12/2004 |
| WO | WO 2006/088036 A1 | 8/2006 |
| WO | WO 2006/101027 A1 | 9/2006 |

OTHER PUBLICATIONS

Y. H. Wang, et al., "Reduction of Oxygen Plasma Damage by Postdeposition Helium Plasma Treatment for Carbon-Doped Silicon Oxide Low Dielectric Constant Films", Electrochemical and Solid-State Letters, The Electrochemical Society, Inc., Singapore, 2003, 6 (1),pp. F1-F3.

S.Pevzner et al; "Thin films of mesoporous silica: preparation and characterization", Current Opinion in Colloid & Interface Science 4, 2000, pp. 420-427.

* cited by examiner

PRECURSOR COMPOSITION FOR POROUS THIN FILM, METHOD FOR PREPARATION OF THE PRECURSOR COMPOSITION, POROUS THIN FILM, METHOD FOR PREPARATION OF THE POROUS THIN FILM, AND SEMICONDUCTOR DEVICE

TECHNICAL FIELD

The present invention relates to a precursor composition for forming a porous thin film and a process for the preparation of the precursor composition, a porous thin film and a process for the preparation of the porous thin film, as well as a semiconductor device. More particularly, the present invention relates to a precursor composition used for forming a hydrophobic porous thin film, which has a low dielectric constant and a low refractive index and which is also excellent in the mechanical strength and a process for the production thereof; a porous thin film prepared using the precursor composition and a process for the preparation thereof; and a semiconductor device prepared using the porous thin film.

BACKGROUND ART

In the field of LSI, there have recently been widely and variously investigated the use of an interlayer dielectric film which is characterized in that it has a low dielectric constant (k) on the order of not more than 2.5 and which is used in combination with a copper wiring pattern or copper electrical connections. It has been proposed that the relative dielectric constant of the interlayer dielectric film is further reduced by making, porous, an oxide film having a low dielectric constant and serving as such an interlayer dielectric film. However, it has presently been known that the use of such porous film suffers from a variety of problems such that (1) the mechanical strength of the film is abruptly reduced, (2) the moisture included in the air is absorbed in and adsorbed onto the wall of the holes or pores present therein and (3) the presence of hydrophobic groups such as $CH_3$ groups introduced into the film for the prevention of such moisture uptake would reduce the adhesion of the film to another film brought into contact with the same. For this reason, in the process for practically applying the porous film to a semiconductor device, in particular, in the chemical mechanical polishing (CMP) process for forming a Cu dual damascene wiring or electrical connection structure and the wire-bonding process, there are observed, for instance, the following problems: (1) the breakage of the porous film due to the reduction of the mechanical strength of the film, (2) the increase in the relative dielectric constant due to the moisture uptake and (3) the occurrence of peeling of the laminated film from the porous interlayer dielectric film due to the reduction of the adhesion between them, and these problems would become a major obstacle in putting the porous thin film into practical use.

Moreover, there has also been proposed a method for forming an oxide having uniform meso fine pores, which makes use of the self-organization of an organic compound and an inorganic compound, for instance, a method for forming such an oxide according to the hydrothermal synthesis technique in a sealed heat-resistant container using, for instance, silica gel and a surfactant (see, for instance, Patent Document 1 specified below) and it has recently been reported that such an oxide having uniform meso fine pores is formed into a film-like shape in order to use the same as a material for semiconductor devices.

For instance, there has been known a method for forming a porous silica film, which comprises the step of immersing a substrate into a liquid sol comprising a condensate of alkoxysilanes and a surfactant to thus precipitate the porous silica onto the substrate surface in the form of a film (see, for instance, Non-Patent Document 1 specified below). There has also been known a method for forming a film on a substrate, which comprises the steps of applying, onto the substrate surface, a solution obtained by blending an organic solvent with a condensate of alkoxysilanes and a surfactant, and then removing the organic solvent through evaporation (see, for instance, Non-Patent Document 2 specified below).

The method for precipitating porous silica onto the substrate surface as disclosed in the aforementioned Non-Patent Document 1 suffers from problems such that it takes a long period of time for the preparation of a film-like porous silica, that the majority of porous silica is precipitated in the form of powder and that the yield of the method is considerably low. For this reason, the method disclosed in Non-Patent Document 2 in which the organic solvent is removed through evaporation is rather effective for the preparation of a porous silica film as compared with the method disclosed in Non-Patent Document 1.

In the method disclosed in Non-Patent Document 2 in which a film is formed on a substrate by the removal of the organic solvent through evaporation, there has been proposed the use of organic solvents such as polyhydric alcohols, glycol ether solvents, glycol acetate ether solvents, amide type solvents, ketone type solvents, and carboxylic acid ester solvents (see, for instance, Patent Document 2 specified below).

However, the porous thin film prepared by the foregoing conventional method includes a large number of hydrophilic portions or sites within the holes or pores thereof, the thin film is thus liable to take in water vapor present in the air and this accordingly results in an increase of the relative dielectric constant of the porous thin film. For this reason, there has been proposed, as a method for the introduction of hydrophobic functional groups into the interlayer dielectric film, for instance, a method for maintaining the dielectric properties thereof by the prevention of any moisture uptake through the conversion of the silanol groups within the fine pores into trimethylsilyl groups (see, for instance, Patent Document 3 specified below). Nevertheless, it has been known that this method never permits the complete conversion of the silanol groups within the fine pores into trimethylsilyl groups (see, for instance, Non-Patent Document 3 specified below).

In addition, there has likewise been proposed a method for the production of a porous thin film which is free of any crack-propagation through the incorporation of Group IA or IIA element into the thin film (see, for instance, Patent Document 4 specified below). In this case, the concentration of such an element to be incorporated into the thin film ranges from 0.0001 to 0.015 parts by mass per 100 parts by mass of a hydrolyzed condensate and this Patent Document also states that if the amount thereof exceeds 0.015 parts by mass, the resulting solution is insufficient in the uniform applicability. However, the results of the supplementary examinations carried out by the inventors of this invention clearly indicate that the use of such an element in such a low amount leads to the formation of a thin film having insufficient mechanical strength and a rather high relative dielectric constant. For this reason, this method never permits the formation of a porous thin film having not only a low dielectric constant, but also a high mechanical strength.

Moreover, there has also been proposed a method for modifying the properties of a porous film which comprises the step of bringing a porous film mainly comprising Si—O bonds into close contact with a specific organic silicon atom-containing compound under heating without using any metallic catalyst in order to simultaneously improve the hydrophobicity and mechanical strength thereof (see, for instance, Patent Document 5 specified below). However, the resulting porous thin film has still been required for the further improvement of the mechanical strength thereof in order to put it into practical use.

Moreover, it has been known that the use of Pt as a catalyst can promote the reaction of siloxane (see, for instance, Patent Document 6 specified below). In this case, the technique relates to the method for making heat resistant ceramics hydrophobic and the resulting porous thin film essentially differs from that serving as an interlayer dielectric film for use in semiconductor devices in that the former contains various impurities including Na.

Patent Document 1: WO 91/11390 pamphlet (see, for instance, the contents of Claims);

Non-Patent Document 1: Nature, 1996, 379:703;

Non-Patent Document 2: Supramolecular Science, 1998, 5:247 or the like;

Patent Document 2: Japanese Un-Examined Patent Publication 2000-38509 (see, for instance, the contents of Section Nos. 0013 and 0014);

Patent Document 3: the specification of U.S. Pat. No. 6,208,014 (see, for instance, the contents of Claims and Abstract);

Non-Patent Document 3: J. Phys. Chem., B, 1997, 101: 6525 or the like;

Patent Document 4: Japanese Un-Examined Patent Publication 2002-3784 (see, for instance, the contents of Claims and Section No. 0004);

Patent Document 5: Japanese Un-Examined Patent Publication 2004-292304 (see, for instance, the content of Claims and Section No. 0020);

Patent Document 6: the specification of U.S. Pat. No. 5,939,141.

DISCLOSURE OF THE INVENTION

Problems That the Invention Is To Solve

It is thus an object of the present invention to solve the foregoing problems associated with the conventional techniques and more specifically to provide a precursor composition useful for the preparation of a porous thin film which has a low dielectric constant and a low refractive index, which is also excellent in the mechanical strength and which is improved in the hydrophobicity, and a method for the preparation of the same; a porous thin film obtained using the precursor composition and a method for the preparation of such a porous thin film; a semiconductor device which makes use of the porous thin film.

Means For the Solution of the Problems

The inventors of this invention have conducted various studies to prepare a hydrophobic porous thin film which has a low dielectric constant and a low refractive index and which is quite excellent in the mechanical strength, have found that the foregoing problems associated with the conventional techniques can effectively be solved by irradiating, with ultraviolet light rays, a porous thin film prepared using a solution of a specific compound-containing precursor composition and then reacting, in a gas phase, the thin film with a specific hydrophobic compound and have thus completed the present invention.

Accordingly, the precursor composition for forming a porous thin film according to the present invention comprises at least one member selected from the group consisting of compounds (A) represented by the following general formula (1) and compounds (B) represented by the following general formula (2):

$$Si(OR^1)_4 \tag{1}$$

$$R_a(Si)(OR^2)_{4-a} \tag{2}$$

(In the foregoing formulas (1) and (2), $R^1$ represents a monovalent organic group; R represents a hydrogen atom, a fluorine atom or a monovalent organic group; $R^2$ represents a monovalent organic group; a is an integer ranging from 1 to 3, provided that R, $R^1$ and $R^2$ may be the same or different from one another); a heat decomposable organic compound (C) which undergoes heat decomposition at a temperature of not less than 250° C.; at least one element (D) selected from the group consisting of amphoteric elements having an electronegativity of not higher than 2.5, elements having an ionic radius of not less than 1.6 Å and elements having an atomic weight of not less than 130; and further a compound (E) which is thermally decomposed at a temperature ranging from 90 to 200° C. and can form an amine through the thermal decomposition and whose aqueous solution and/or solution in an alcohol/water mixed solvent have a pH value falling within the range of from 6.5 to 8, at a temperature of not higher than the heat-decomposition temperature thereof.

In this respect, a problem arises such that if the foregoing heat-decomposable organic compound (C) used is one having a heat-decomposition temperature of less than 250° C., the compound (C) is decomposed prior to the polymerization of the alkoxysilanes represented by the foregoing general formulas (1) and (2) and accordingly, it is difficult to obtain a porous thin film having a desired pore size.

Regarding the element (D), a problem also arises such that if the Pauling's electronegativity of a specific element (D) exceeds 2.5, it would be quite difficult to form non-crosslinked oxygen capable of accelerating the reaction of organic silicon atom-containing compounds, which can form a product capable of mechanically reinforcing the resulting porous thin film. If the element selected has an ionic radius of not less than 1.6 Å, the element cannot travel or migrate inside the SiO₂ layer, while if the element selected has an atomic weight of not less than 130, it is piled up at the boundary of the layer containing the same with other layers and never undergoes any further diffusion. In respect of the ionic radius and the atomic weight, it has been known that among the alkali metals, whose mobility in an insulating film such as SiO₂ film is extremely high, those having an ionic radius of not less than 1.6 Å such as Rb cannot easily travel inside the SiO₂ layer (Journal of Applied Physics, Vol. 56, p. 2218) and further, in respect of the elements each having an atomic weight of not less than 130, it has also been known that, for instance, Cs having an atomic weight of 133 is piled up at the boundary thereof with other layers and never undergoes any further diffusion (Applied Physics Letters, Vol. 50, p. 1200). Accordingly, it can be concluded, in the present invention, that if either of the foregoing requirements for the ionic radius and for the atomic weight is satisfied, the element (D) cannot travel inside the SiO₂ film or never diffuses even to the exterior of the thin film through the boundary.

If a compound capable of being thermally decomposed at a temperature ranging from 90 to 200° C. is selected as the foregoing compound (E), the compound does not serve as a catalyst at the time of the addition thereof, but can serve as a catalyst after it is applied onto the surface of a substrate and the temperature thereof is raised. In addition, if the solution of the compound (E) is acidic or has a pH of less than 6.5, the compound can serve as a catalyst to thus accelerate the hydrolysis through the electrophilic reaction, while if the pH value of the solution exceeds 8, the compound would accelerate the hydrolysis through the electrophilic reaction as soon as it is added to thus cause gelation. In other words, the use of such a compound (E) is not preferred since it would be accompanied by various undesirable affairs when applying the resulting porous material to the semiconductor devices.

The heat-decomposable organic compound (C) included in the foregoing precursor composition is characterized in that it comprises at least one surfactant having a molecular weight ranging from 200 to 5000. This is because if the molecular weight of the surfactant is less than 200, the pore size of the resulting porous thin film is too small, while if the molecular weight thereof exceeds 5000, the pore size of the resulting porous thin film is too large.

The precursor composition is further characterized in that the content of metallic ion impurities other than the foregoing element (D) present in the composition is not higher than 10 ppb. In this respect, if the content of such metallic ion impurities exceeds 10 ppb, the reliability of the finally obtained semiconductor devices is considerably adversely affected.

The precursor composition is characterized in that the foregoing element (D) is at least one element selected from the group consisting of B, Al, P, Zn, Ga, Ge, As, Se, In, Sn, Sb, Te, Rb, Cs, Ba, La, Hf, Ta, W, Re, Os, Ir, Pt, Au, Hg, Tl, Pb, Bi, Po, At and lanthanum series.

The precursor composition is characterized in that the foregoing compound (E) is present in the composition in a concentration ranging from 0.03 to 0.13 mole per mole of the Si atoms included in the precursor composition. This is because, the use of the compound (E) in a concentration of less than 0.03 mole and higher than 0.13 mole with respect to the quantity of the Si atoms is not preferred, since the resulting porous thin film has a considerably high relative dielectric constant.

Preferably used herein as the foregoing organic compound (E) are ones each having at least one member selected from the group consisting of a urea bond, a urethane bond, and an amide bond. Preferably used herein as the organic compound having a urea bond is at least one urea compound represented by the following general formula (3):

$$R^1\text{—}N(R^2)\text{—}CO\text{—}N(R^3)\text{—}R^4 \qquad (3)$$

(In the Formula (3), $R^1$, $R^2$, $R^3$, and $R^4$ may be the same or different from one another and each represent H, $C_6H_5$, or $C_aH_{2a+1}$, and a is an integer ranging from 1 to 3). Specific examples thereof are urea, methylurea, 1,1-dimethylurea, 1,3-dimethylurea, and ethylurea. Among them, particularly preferred is urea.

Moreover, preferably used herein as the organic compound having a urethane bond is at least one urethane compound represented by the following general formula (4):

$$R^1\text{—}N(R^2)\text{—}CO\text{—}O\text{—}R^3 \qquad (4)$$

(In the Formula (4), $R^1$, $R^2$, and $R^3$ may be the same or different from one another and each represent H, $C_6H_5$, or $C_aH_{2a+1}$, and a is an integer ranging from 1 to 3). Specific examples thereof are methyl carbamate, and ethyl carbamate.

Further, preferably used herein as the organic compound having an amide bond is at least one amide compound represented by the following general formula (5):

$$R^1\text{—}N(R^2)\text{—}CO\text{—}R^3 \qquad (5)$$

(In the Formula (4), $R^1$, $R^2$, and $R^3$ may be the same or different from one another and each represent H, $C_6H_5$, or $C_aH_{2a+1}$, and a is an integer ranging from 1 to 3). Specific examples thereof are acetamide, N-methylformamide, and N,N-dimethylformamide.

In the present invention, the compound (E) may be a member selected from the group consisting of organic compounds each having a urea bond and represented by the general formula (3), organic compounds each having a urethane bond and represented by the general formula (4), and organic compounds each having an amide bond and represented by the general formula (5), which may be used alone or in any combination of at least two of them. Among them, preferably used in the present invention are organic compounds each having a urea bond and represented by the general formula (3).

The precursor composition for forming a porous thin film according to the present invention can be prepared by a method comprising the steps of blending, in an organic solvent, at least one member selected from the group consisting of compounds (A) represented by the following general formula (1) and compounds (B) represented by the following general formula (2):

$$Si(OR^1)_4 \qquad (1)$$

$$R_a(Si)(OR^2)_{4-a} \qquad (2)$$

(In the foregoing formulas (1) and (2), $R^1$ represents a monovalent organic group; R represents a hydrogen atom, a fluorine atom or a monovalent organic group; $R^2$ represents a monovalent organic group; a is an integer ranging from 1 to 3, provided that R, $R^1$ and $R^2$ may be the same or different from one another); a heat decomposable organic compound (C) which undergoes heat decomposition at a temperature of not less than 250° C.; and at least one element (D) selected from the group consisting of amphoteric elements having an electronegativity of not higher than 2.5, elements having an ionic radius of not less than 1.6 Å and elements having an atomic weight of not less than 130, or at least one compound containing the element (D); and then mixing the resulting mixed solution with a compound (E) which is thermally decomposed at a temperature ranging from 90 to 200° C. and can form an amine through the thermal decomposition and whose aqueous solution and/or solution in an alcohol/water mixed solvent have a pH value falling within the range of from 6.5 to 8, at a temperature of not higher than the heat-decomposition temperature thereof.

Alternatively, the foregoing precursor composition can also be prepared by a method comprising the steps of blending, in an organic solvent, at least one member selected from the group consisting of the compounds (A) represented by the foregoing general formula (1) and the compounds (B) represented by the foregoing general formula (2) with the foregoing heat decomposable organic compound (C) to give a mixed solution; adding the foregoing at least one element (D) or the at least one compound containing the element (D) to the resulting mixed solution and then mixing them to give a solution; and blending the resulting solution with a compound (E) which is thermally decomposed at a temperature ranging from 90 to 200° C. and can form an amine through the thermal decomposition and whose aqueous solution and/or solution in an alcohol/water mixed solvent have a pH value falling within the range of from 6.5 to 8, at a temperature of not higher than the heat-decomposition temperature thereof.

In the aforementioned method for the preparation of the precursor composition, the heat decomposable organic compound (C) the metallic ion impurities present in the precursor composition, and the elements (D) to be added, as well as the compound (E) such as urea and the molar concentration, per mole of Si atom, of the compound (E) are the same as those discussed above.

The method for the preparation of a porous thin film according to the present invention comprises the steps of applying, onto the surface of a substrate, a solution of the foregoing precursor composition for forming the porous thin film or the solution of the foregoing precursor composition for forming a porous thin film prepared according to the method for the preparation of the precursor composition described above; drying the coated layer of the solution by heating the same at a temperature ranging from 100 to 400° C.; irradiating the porous thin film thus formed on the substrate surface with ultraviolet rays having a wavelength ranging from 157 to 344 nm; and then reacting the porous thin film with a hydrophobic compound having a hydrophobic group and at least one group selected from polymerizable groups through a gas-phase reaction carried out at a temperature ranging from 100 to 600° C. to thus form a hydrophobic porous thin film.

In the method for the preparation of a porous thin film as described above, if the drying temperature is less than 100° C., any desired film cannot be formed, while if the drying temperature exceeds 400° C., pores are insufficiently formed within the resulting porous thin film. Moreover, if the reaction temperature during the foregoing gas-phase reaction is less than 100° C., the gas-phase reaction would insufficiently proceed, while if it exceeds 600° C., the porous thin film undergoes shrinkage and this in turn results in an increase of the relative dielectric constant thereof.

The present invention is characterized in that the hydrophobic compound used in the reaction described above is a compound which has at least one hydrophobic group selected from alkyl groups each having 1 to 6 carbon atoms and a $C_6H_5$ group and at least one polymerizable group selected from a hydrogen atom, an OH group and a halogen atom. In this respect, however, if the carbon atom number of the compound is not less than 7, the molecular size of the compound is too large and this would adversely affect the diffusion thereof into the holes or pores present within the thin film.

The present invention is likewise characterized in that the hydrophobic compound used in the reaction described above is an organic silicon atom-containing compound having at least one kind of binding unit represented by the formula: Si—X—Si (wherein X represents an oxygen atom, an $NR^3$ group, a $C_nH_{2n}$ group or a $C_6H_4$ group, $R^3$ represents a $C_mH_{2m+1}$ group or a $C_6H_5$ group, n is 1 or 2 and m is an integer ranging from 1 to 6) and at least two kinds of binding units represented by the formula: Si-A (wherein A represents a hydrogen atom, an OH group, an $OC_bH_{2b+1}$ group or a halogen atom, provided that a plurality of substituents A present in the same molecule may be the same or different, and b is an integer ranging from 1 to 6).

In the hydrophobic compound, if n is not less than 3, the size of the hydrophobic group per se is too large and this in turn makes any sufficient polymerization of the compound difficult, while if m is not less than 7 and b is not less than 7, the molecular size of the compound is too large and this would adversely affect the diffusion thereof into the holes present within the thin film. Moreover, the halogen atom is a fluorine, chlorine, bromine or iodine atom.

The porous thin film of the present invention is one prepared according to the method for the preparation of porous thin film discussed above.

The semiconductor device according to the present invention is one obtained using the porous thin film prepared according to the foregoing porous thin film preparation method.

A porous thin film having improved mechanical strength can be produced by repeating the foregoing porous thin film-preparation method over a desired times.

The hydrophobized porous thin film according to the present invention can be produced according to the porous thin film-production method described above and the use of the hydrophobized porous thin film in turn permits the production of the semiconductor device according to the present invention.

Effects of the Invention

The present invention shows the following various effects: the use of the precursor composition for the porous thin film of the present invention permits the production of a porous thin film which has a low dielectric constant and a low refractive index, which is also excellent in the mechanical strength and which is improved in the hydrophobicity; and the use of the porous thin film permits the production of a desired semiconductor device.

Best Mode For Carrying Out the Invention

According to an embodiment of the present invention, a porous thin film having desired properties can be prepared from a solution of precursor composition comprising at least one member selected from the group consisting of compounds (A) represented by the following general formula (1) and compounds (B) represented by the following general formula (2):

$$Si(OR^1)_4 \tag{1}$$

$$R_a(Si)(OR^2)_{4-a} \tag{2}$$

(In the foregoing formulas (1) and (2), $R^1$ represents a monovalent organic group; R represents a hydrogen atom, a fluorine atom or a monovalent organic group; $R^2$ represents a monovalent organic group; a is an integer ranging from 1 to 3, provided that R, $R^1$ and $R^2$ may be the same or different from one another); a heat decomposable organic compound (C) comprising a surfactant which has a molecular weight ranging from 200 to 5000, which undergoes heat decomposition at a temperature of not less than 250° C.; at least one element (D) selected from the group consisting of elements each having a specific Pauling's electronegativity, elements each having a specific ionic radius and elements each having a specific atomic weight; and a compound (E) such as urea, which is thermally decomposed at a temperature ranging from 90 to 200° C. and can form an amine through the thermal decomposition thereof and whose aqueous solution and/or solution in an alcohol/water mixed solvent have a pH value falling within the range of from 6.5 to 8, at a temperature of not higher than the heat-decomposition temperature thereof, as well as an organic solvent.

The foregoing solution of the precursor composition may likewise be prepared by blending, in an organic solvent, at least one compound selected from the compounds (A) and the compounds (B), the heat-decomposable organic compound (C) and a desired element (D) or the compound containing the element (D), and further blending the resulting solution with the foregoing compound (E). Alternatively, the solution of the precursor composition may also be prepared by blending, in an organic solvent, at least one compound selected from the compounds (A) and the compounds (B) and the heat-decomposable organic compound (C); adding the element (D) or the compound containing the element (D) to the resulting mixed solution, followed by mixing them; and then blending the resulting solution with the foregoing compound (E). In this respect, the order of the addition and/or mixing of these components or compounds is not restricted to any particular one.

An example of the method for preparing the solution of the precursor composition for forming porous thin films will now be described in more specifically below.

For instance, to a mixture of at least one compound selected from those represented by the foregoing general formulas (1) and (2), water and an organic solvent, there is added an acidic or basic catalyst for the hydrolyzation of the $OR^1$, $OR^2$ groups present in the compounds of Formulas (1) and (2), followed by the stirring of the resulting mixture at a temperature ranging from 20 to 80° C. for 30 minutes to 5 hours to thus cause the hydrolyzation of the compounds of Formulas (1) and (2) and to thereby prepare a desired solution. Then a surfactant is dropwise added, in small portions, to the resulting solution with stirring in such a manner that the rate of the addition thereof falls within the range of from $10^{-6}$ to $10^{-2}$ mole/sec. In this respect, the surfactant may be dropwise added directly or after diluting the same with, for instance, an organic solvent, and the amount of the surfactant to be dropwise added per unit time may vary depending on the molecular weight thereof. However, if the amount thereof is too great, the surfactant is insufficiently dispersed and the solution finally obtained is not uniform. The mixing ratio of the foregoing raw materials may properly be determined while taking into consideration the intended relative dielectric constant of the porous thin film as the final product.

When carrying out the foregoing hydrolysis with, for instance, an acidic catalyst, according to the conventional method, the crosslinking of Si—OH linearly propagates or proceeds to thus form a two-dimensional network structure or it is sometimes observed that the compound represented by the general formulas (1) and (2) is not completely hydrolyzed. Accordingly, to accelerate the hydrolysis, it may be effective to shift the pH value of the hydrolysis system toward the acidic region. However, the ultimate object of the present invention is to use the resulting porous thin film in a semiconductor device and accordingly, it would be impossible to promote the hydrolysis through the reduction of the pH value of the system. For this reason, the present invention is so designed that the following component is incorporated into the precursor composition in a desired step, in order to accomplish the intended purposes of the invention: the compound (E) such as urea which is neutral at a temperature of not higher than the vaporization temperature of an organic solvent used, which can thermally be decomposed at a temperature lower than the decomposition temperature of the heat-decomposable and pore-forming organic compound (C) (such as a surfactant) to form a basic substance such as ammonia and to thus permit the acceleration of the hydrolysis of the compounds represented by the general formulas (1) and (2) present in the solution of the precursor composition. More specifically, this compound (E) is one which is capable of undergoing thermal decomposition at a temperature ranging from 90 to 200° C. to thus generate amine compounds through the thermal decomposition thereof and whose aqueous solution and/or solution in an alcohol/water mixed solvent have a pH value falling within the range of from 6.5 to 8, at a temperature of not higher than the heat-decomposition temperature thereof. This compound (E) is added to the precursor composition in an amount which never adversely affects the relative dielectric constant of the resulting porous thin film.

An additive element (D) is added to and blended with the foregoing mixed solution. In this case, the element (D) maybe added to and mixed with the precursor composition in the form of either the element (D) per se or an element (D)-containing compound, which may be used alone or in any combination of at least two of them. In this connection, the method of and the time of adding the same are not restricted to specific ones at all. For instance, as has already been discussed above, every components of the solution may be, in order, added and blended during the preparation of the mixed solution, or all of the components may be simultaneously added and admixed during the preparation of the mixed solution. In addition, the amount or concentration of the component (D) to be used is not restricted to any particular one inasmuch as it is not less than that capable of promoting the crosslinking of a silylation compound (a hydrophobic compound) during the silylation treatment and not more than that capable of maintaining the dielectric properties of the resulting thin film. For instance, it desirably ranges from 50 to 5000 ppm. The solution finally obtained is stirred at a temperature ranging from 20 to 50° C. and preferably 25 to 30° C. for 30 minutes to 24 hours to thus obtain a precursor composition-containing solution used for forming a porous thin film.

The compound (E) such as urea as has been described above is added to and blended with the precursor-containing solution thus prepared to give a precursor solution, the latter is then applied onto the surface of a substrate, the resulting film is heated to a temperature of not less than 90° C. or the heat-decomposition temperature of the compound (E) to thus generate an amine capable of serving as a basic catalyst, the un-hydrolyzed portion remaining in the precursor is completely hydrolyzed due to the action of the catalyst and the three-dimensional crosslinking of Si—OH groups is likewise promoted because of the basic nature of the reaction system. Accordingly, the process of the present invention permits the preparation of a porous silica thin film having a stronger silica network. In this respect, the step or manner of adding the compound (E) is not restricted to any specific one and it may be added according to, for instance, the step as has been discussed above.

The aforementioned method for adding the compound (E) and for processing the precursor composition is one commonly called "uniform precipitation technique", but there has not yet been known any report on the use of such method in the field of the film, in particular, in the field of the porous film. In the case of the commonly used uniform precipitation technique, the amount of urea to be added is in general several ten to several hundred times that used in the present invention. In the case of the present invention, however, the use of such a large amount of urea would damage, for instance, the surfactant used for forming pores and ultimately leads to an increase of the relative dielectric constant of the resulting porous thin film. The range thereof which never adversely affects the relative dielectric constant in general ranges from 0.03 to 0.13 mole per unit mole of the Si atoms present in the precursor composition, as will be proved by the results observed in Examples given later.

Moreover, when mixing, with the precursor composition, a metallic element (D) belonging to the 6th period in the periodic table as a catalyst for the formation of an Si—O network and the surface polymerization of TMCTS, the introduction of a large quantity of such a metallic element into the composition would adversely affect the electrical properties of the resulting thin film. If urea is added in an amount specified in Examples as will be described later, however, the influence thereof on the electrical properties can significantly be reduced.

According to the present invention, a porous thin film is formed by applying, onto the surface of a substrate, a porous thin film-forming solution containing the foregoing precursor composition which is blended with a compound (E) for the improvement of the hydrophobicity of the resulting porous thin film or a porous thin film-forming solution containing the foregoing precursor composition which is prepared according to the precursor composition-preparation method described above and which comprises a compound (E) incorporated into the same and then the coated layer of the solution is dried by heating the same at a temperature ranging from 100 to 400° C. The porous thin film formed on the substrate surface is irradiated with ultraviolet rays having a wavelength ranging from 157 to 344 nm, which has an energy lower than the binding energy of the Si—O bond and higher than the binding energy of the Si—C bond, followed by subjecting, to a gas-phase reaction at a temperature ranging from 100 to 600° C., a hydrophobic compound having a hydrophobic group and at least one member selected from the group consisting of polymerizable groups, such as a hydrophobic compound having at least one hydrophobic group (for instance, an alkyl group having at most 6 carbon atoms or a phenyl group) and at least one polymerizable group (for instance, a hydrogen atom, an OH group or a halogen atom).

With the recent progress of the fine patterning or processing of the semiconductor devices, it has been required for the reduction of the relative dielectric constant of various thin films used therein and simultaneously, the requirements for the film-forming temperature and atmosphere have increasingly been strict. In other words, the firing temperature of the porous silica on the order of 400° C. has conventionally been permitted, but there have recently been regulated that the firing temperature should be not more than 350° C. in the recent processing of the semiconductor devices and the thermal treatment should be carried out in an inert gas atmosphere such as a nitrogen gas atmosphere. However, various problems arise such that any surfactant used is not completely decomposed when carrying out the firing at such a low firing temperature and in such a severe firing atmosphere and this in turn results in the formation of organic residues and that the use of such a low firing temperature would result in the insufficient progress of the crosslinking of the silica wall and the unsatisfied progress of the crosslinking of the silylation compound and this accordingly results in the formation of a thin film having a low mechanical strength.

For this reason, in the process of the present invention, the porous thin film formed on the substrate surface is first irradiated with ultraviolet rays having a wavelength ranging from 157 to 344 nm, which has an energy lower than the binding energy of the Si—O bond and higher than the binding energy of the Si—C bond, as has been described above, to thus remove the organic residues and then the silica walls are reinforced using a hydrophobic compound or a silylation compound. In this connection, the thin film can again be irradiated with ultraviolet rays and reinforced with the silylation compound and this would permit the preparation of a porous silica thin film having a further improved mechanical strength. In addition, the radiant rays used for the irradiation of the thin film are not restricted to ultraviolet rays insofar as they can decompose the organic residues and have an energy which never breaks the Si—O bonds and accordingly, effectively used as such radiant rays include, for instance, electron beams accelerated to the state having a desired energy.

According to the present invention, a hydrophobic compound is introduced into the pores within the porous silica thin film in its gaseous state to thus form a film of the hydrophobic compound on the inner wall of the pores, as has been described above. When a polymer film is thus bound to the inner wall of the pores to thus improve the quality of the porous thin film, the element (D) present therein may disturb or deteriorate the electrically neutral nature of the thin film, the gas-phase crosslinking reaction can drastically be promoted by generating non-crosslinked oxygen atoms having excess crosslinking sites within the porous oxide thin film. This element has a so-called catalyst-like action and this accordingly permits the formation of a porous thin film having a low dielectric constant and a high mechanical strength (such as the improvement of the elastic modulus and hardness due to the reinforcement of the pore structure) and to which excellent hydrophobicity is imparted. Such an excellent thin film has never been able to be obtained according to the conventional methods. Furthermore, the presence of such an element would permit the acceleration of the gas-phase reaction and therefore, all of the temperatures used in the heat treatments included in the production process can be reduced. More specifically, when the present invention is applied to the method for forming an interlayer dielectric film used in the semiconductor devices which eagerly and strongly require the use of fine patterning techniques, the heat-treatment currently carried out at a temperature of 400° C. can be replaced with a low temperature firing treatment carried out at a temperature of not more than 350° C. and the latter would permit the formation of a thin film having a sufficiently high mechanical strength.

Each component of the foregoing precursor composition and the porous thin film will now be described in more detail below.

(Alkoxysilanes)

In the compounds (A) and (B) represented by the foregoing general formulas (1) and (2), the monovalent organic groups denoted by R, $R^1$ and $R^2$ include, for instance, alkyl groups, aryl groups, allyl groups and glycidyl groups.

The monovalent organic group denoted by $R^1$ appearing in the general formula (1) includes, for instance, an alkyl group or an aryl group. The alkyl groups are preferably those each having 1 to 5 carbon atoms and specific examples thereof include methyl, ethyl, propyl, and butyl groups. These alkyl groups may be linear or branched ones and part of the hydrogen atoms thereof may be substituted with, for instance, halogen atoms. Examples of the aryl groups include phenyl, naphthyl, methylphenyl, ethylphenyl, chlorophenyl, bromophenyl, and fluorophenyl groups. The monovalent organic groups denoted by $R^1$ are preferably alkyl and phenyl groups. Moreover, the monovalent organic groups denoted by R and $R^2$ appearing in the general formula (2) include, for instance, organic groups identical to those described above in connection with the substituent $R^1$ appearing in the general formula (1).

The alkoxysilane represented by the general formula (1) and (2) and usable in the present invention is not restricted to any particular one and specific examples thereof include those listed below:

For instance, quaternary alkoxysilanes such as tetramethoxysilane, tetraethoxysilane, tetrapropoxysilane, and tetrabutoxysilane; tertiary alkoxyfluorosilanes such as trimethoxyfluorosilane, triethoxyfluorosilane, triisopropoxyfluorosilane, and tributoxyfluorosilane;

fluorine atom-containing alkoxysilanes such as $CF_3(CF_2)_3$ $CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2CH_2Si(OCH_3)_3$, $(CF_3)_2CF(CF_2)_4CH_2CH_2Si(OCH_3)_3$, $(CF_3)_2CF(CF_2)_6CH_2CH_2Si(OCH_3)_3$, $(CF_3)_2CF(CF_2)_8CH_2CH_2Si(OCH_3)_3$, $CF_3(C_6H_4)CH_2CH_2Si(O\ CH_3)_3$, $CF_3(CF_2)_3(C_6H_4)CH_2CH_2Si(OCH_3)_3$, $CF_3(CF_2)_5(C_6H_4)CH_2CH_2Si(OCH_3)_3$, $CF_3(CF_2)_7(C_6H_4)CH_2CH_2Si(OCH_3)_3$, $CF_3(CF_2)_3CH_2CH_2SiCH_3(OCH_3)_2$, $CF_3(CF_2)_5CH_2CH_2SiCH_3$ (OCH$_3$)$_2$, CF$_3$(CF$_2$)$_7$CH$_2$CH$_2$SiCH$_3$(OCH$_3$)$_2$, CF$_3$(CF$_2$)$_9$CH$_2$CH$_2$SiCH$_3$(OCH$_3$)$_2$, (CF$_3$)$_2$CF(CF$_2$)$_4$CH$_2$CH$_2$SiCH$_3$(OCH$_3$)$_2$, (CF$_3$)$_2$CF(CF$_2$)$_6$CH$_2$CH$_2$SiCH$_3$(OCH$_3$)$_2$, (CF$_3$)$_2$CF(CF$_2$)$_8$CH$_2$CH$_2$SiCH$_3$(OCH$_3$)$_2$, CF$_3$(C$_6$H$_4$)CH$_2$CH$_2$SiCH$_3$(OCH$_3$)$_2$, CF$_3$(CF$_2$)$_3$(C$_6$H$_4$)CH$_2$CH$_2$SiCH$_3$(OCH$_3$)$_2$, CF$_3$(CF$_2$)$_5$(C$_6$H$_4$)CH$_2$CH$_2$SiCH$_3$(OCH$_3$)$_2$, CF$_3$(CF$_2$)$_7$(C$_6$H$_4$)CH$_2$CH$_2$SiCH$_3$(OCH$_3$)$_2$, CF$_3$(CF$_2$)$_3$CH$_2$CH$_2$Si(OCH$_2$CH$_3$)$_3$, CF$_3$(CF$_2$)$_5$CH$_2$CH$_2$Si(OCH$_2$CH$_3$)$_3$, CF$_3$(CF$_2$)$_7$CH$_2$CH$_2$Si(OCH$_2$CH$_3$)$_3$, CF$_3$(CF$_2$)$_9$CH$_2$CH$_2$Si(OCH$_2$CH$_3$)$_3$;

tertiary alkoxyalkylsilanes such as trimethoxymethylsilane, triethoxymethylsilane, trimethoxyethylsilane, triethoxyethylsilane, trimethoxypropylsilane, and triethoxypropylsilane;

tertiary alkoxyarylsilanes such as trimethoxyphenylsilane, triethoxyphenylsilane, trimethoxychlorophenylsilane, and triethoxychlorophenylsilane;

tertiary alkoxyphenethylsilanes such as trimethoxyphenethylsilane and triethoxyphenethylsilane; and secondary alkoxyalkylsilanes such as dimethoxydimethylsilane and diethoxydimethylsilane.

In the present invention, the alkoxysilanes listed above may be used alone or in any combination of at least two of them.

(Organic Solvents)

Examples of organic solvents usable in the present invention include monohydric alcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethyl heptanol-4, n-decanol, sec-undecyl alcohol, trimethylnonyl alcohol, sec-tetradecyl alcohol, sec-heptadecyl alcohol, phenol, cyclohexanol, methyl cyclohexanol, 3,3,5-trimethyl cyclohexanol, benzyl alcohol, phenyl methyl carbinol, diacetone alcohol, and cresol;

polyhydric alcoholic solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin;

ketone type solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, 2-hexanone, methyl cyclohexanone, 2,4-pentanedione, acetonyl acetone, di-acetone alcohol, acetophenone, and fenthion;

ether type solvents such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyl tetrahydrofuran;

ester type solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methyl cyclohexyl acetate, n-nonyl acetate, methyl acetoacetate, ethyl acetoacetate, acetic acid ethylene glycol monomethyl ether, acetic acid ethylene glycol monoethyl ether, acetic acid diethylene glycol monomethyl ether, acetic acid diethylene glycol monoethyl ether, acetic acid diethylene glycol mono-n-butyl ether, acetic acid propylene glycol monomethyl ether, acetic acid propylene glycol monoethyl ether, acetic acid propylene glycol monopropyl ether, acetic acid propylene glycol monobutyl ether, acetic acid dipropylene glycol monomethyl ether, acetic acid dipropylene glycol monoethyl ether, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; and nitrogen atom-containing solvents such as N-methylformamide, N,N-dimethylformamide, N,N-diethylformamide, acetamide, N-methylacetamide, N,N-dimethylacetamide, N-methylpropinamide, and N-methylpyrrolidone.

In the present invention, the foregoing organic solvents may be used alone or in any combination of at least two of them.

(Acidic And Basic Catalysts)

In the present invention, the catalyst capable of being incorporated into the precursor composition-containing solution is at least one of acidic catalysts or basic catalysts.

The acidic catalyst may be, for instance, inorganic acid and organic acid.

Examples of such inorganic acids are hydrochloric acid, nitric acid, sulfuric acid, hydrofluoric acid, phosphoric acid, boric acid and hydrobromic acid.

Examples of such organic acids include acetic acid, propionic acid, butyric acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, mellitic acid, arachidic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, and malic acid.

As the basic catalysts, there may be listed, for instance, ammonium salts and nitrogen atom-containing compounds.

Examples of ammonium salts include tetramethyl ammonium hydroxide, tetraethyl ammonium hydroxide, tetrapropyl ammonium hydroxide, and tetrabutyl ammonium hydroxide.

Examples of such nitrogen atom-containing compounds are pyridine, pyrrole, piperidine, 1-methyl piperidine, 2-methyl piperidine, 3-methyl piperidine, 4-methyl piperidine, piperazine, 1-methylpiperazine, 2-methylpiperazine, 1,4-dimethylpiperazine, pyrrolidine, 1-methyl pyrrolidine, picoline, monoethanolamine, diethanolamine, dimethyl monoethanolamine, monomethyl diethanolamine, triethanolamine, diazabicyclooctene, diazabicyclononane, diazabicycloundecene, 2-pyrazoline, 3-pyrroline, quinuclidine, ammonia, methylamine, ethylamine, propylamine, butylamine, N,N-dimethylamine, N,N-diethylamine, N,N-dipropylamine, N,N-dibutylamine, trimethylamine, triethylamine, tripropylamine, and tributylamine.

Furthermore, it is also possible to use, as such catalysts, all of the added element (D)-containing acidic and basic compounds used in the present invention.

(Surfactants)

The surfactant capable of being used in the precursor composition-containing solution according to the present invention is not restricted to any particular one inasmuch as it has a molecular weight ranging, for instance, from 200 to 5000. This is because if it has a small molecular weight, the pores formed have an extremely small pore size and therefore, this makes, difficult, the penetration of any subject compound into the pores in the gas-phase reaction after the formation of the pores, while if the surfactant has a large molecular weight, the pores formed have an extremely large pore size. Preferably used herein as such surfactants are, for instance, those listed below:

(I) Compounds each having a long chain alkyl group and a hydrophilic group: In this respect, the long chain alkyl group may preferably be one having 8 to 24 carbon atoms and more preferably one desirably having 12 to 18 carbon atoms, while the hydrophilic group thereof may be, for instance, a quaternary ammonium group, an amino group, a nitroso group, a hydroxyl group, and a carboxyl group, and desirably used herein include, for instance, a quaternary ammonium group, or a hydroxyl group, among others. Specific examples of such surfactants preferably used in the present invention are alkylammonium salts represented by the following general formula:

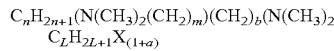

$$C_nH_{2n+1}(N(CH_3)_2(CH_2)_m)(CH_2)_b(N(CH_3)_2$$
$$C_LH_{2L+1}X_{(1+a)}$$

(In the foregoing general formula, a is an integer ranging from 0 to 2, b is an integer ranging from 0 to 4, n is an integer ranging from 8 to 24, m is an integer ranging from 0 to 12, L is an integer ranging from 1 to 24, X represents a halide ion, $HSO_4^-$, or a monovalent organic anion). If a, b, n, m, and L fall within the ranges specified above, respectively, and if X represents an ion specified above, the pores formed have a proper pore size and a sufficient amount of any subject compound can penetrate into the pores during the gas-phase reaction after the formation of the pores to thus ensure the occurrence of an intended polymerization reaction.

(II) Compounds each having a polyalkylene oxide structure: In this connection, examples of such polyalkylene oxide structures are polyethylene oxide structure, polypropylene oxide structure, polytetramethylene oxide structure, and polybutylene oxide structure. Specific examples of the compounds having such polyalkylene oxide structures include ether type compounds such as polyoxyethylene polyoxypropylene block copolymers, polyoxyethylene polyoxybutylene block copolymers, polyoxyethylene polyoxypropylene alkyl ethers, polyethylene alkyl ethers, and polyoxyethylene alkylphenyl ethers; and ether-ester type compounds such as polyoxyethylene glycerin fatty acid esters, polyoxyethylene sorbitan fatty acid esters, polyethylene sorbitol fatty acid esters, sorbitan fatty acid esters, propylene glycol fatty acid esters, and sucrose fatty acid esters.

In the present invention, the surfactants listed above can be used alone or in any combination of at least two of them.

(Additive Elements)

Regarding the additive element (D) used in the present invention, it is quite important to increase the number of non-crosslinked oxygen atoms present in the $SiO_2$ basic skeleton of the porous thin film, from the viewpoint of promoting the gas-phase reaction in the present invention as has been discussed above. When it is intended to increase the number of non-crosslinked oxygen atoms present in the Si-O bonds as the basic skeleton of the porous thin film and to thereby promote the gas-phase reaction, the use of elements having a Pauling's electronegativity of Si atom or 1.8, such as an oxygen atom (3.5) and a C atom (2.5) is not desirable since such elements having high electronegativity are quite susceptible to the formation of covalent bonds in the porous thin film including Si—O and optionally Si—C bonds and therefore, they are not suitable for the achievement of the purpose of the present invention to the effect that the number of non-crosslinked oxygen atoms is increased through the formation of ionic linkages with Si atoms to thus promote the catalytic action of metallic elements. In addition, at this stage, the metal element to be incorporated into the porous thin film should satisfy such requirements that it can stably be maintained within the thin film even when any stress, in particular, electric stress is applied and that it never adversely affects the components other than the porous thin film in the subject to which the porous thin film is applied, such as a semiconductor device. The use of the usual metal element as that to be incorporated into the thin film is not desirable, since the presence thereof would adversely affect the quality of semiconductor device directly. However, amphoteric elements such as Al, Zn, Sn, and Pb never adversely affect the semiconductor and have already been used in the semiconductor devices although they are metallic elements. Moreover, the following elements can be used in the invention without any trouble: those each having an ionic radius of not less than 1.6 Å and those each having an atomic weight of not less than 130, which can migrate, with great difficulty, through the porous thin film even when an electric stress is applied to the thin film to some extent; and more specifically, the heavy elements (those having an atomic number of equal to or higher than 55) belonging to the $6^{th}$ period in the periodic table.

Examples of the additive element (D) which can satisfy the foregoing requirements and which can be used in the present invention are B, Al, P, Zn, Ga, Ge, As, Se, In, Sn, Sb, Te, Rb, Cs, Ba, La, Hf, Ta, W, Re, Os, Ir, Pt, Au, Hg, Tl, Pb, Bi, Po, At and lanthanum series. Among them, preferably used in the invention are at least one member selected from the group consisting of Cs, Ba, lanthanum series, Hf, P, Pb, Bi, Po, Se, Te, As, Rb, Al and Sn. In this respect, it is sufficient that at least one of these elements is incorporated into the precursor composition for forming the porous thin film.

The method for introducing the foregoing additive element into the thin film is not restricted to any particular one and may be, for instance, one in which an element selected is directly added thereto or one in which a compound containing the desired element is added. Such compound containing each intended element is not restricted to any specific one and may be, for instance, nitrates, oxides, organometal compounds, basic compounds and any known compounds which can form or generate each metal element usable in the invention. Thus, each desired element can be incorporated into the porous thin film using these compounds. At this stage, these compounds are preferably introduced into the precursor composition in the form of a mixture with water or an organic solvent such as an alcohol.

It is sufficient to add the additive element in a catalytic amount, but the concentration thereof preferably ranges from 50 to 5000 ppm relative to the precursor composition-containing solution, as will be clear from the results obtained in Reference Example 2 given later.

(Hydrophobic Compounds)

The hydrophobic compound, which can be used in the present invention, is preferably a compound having at least one each of hydrophobic group selected from the group consisting of alkyl groups each having 1 to 6 carbon atoms and $C_6H_5$ group, and polymerizable group selected from the group consisting of a hydrogen atom, an OH group and halogen atoms. Examples of such alkyl groups include methyl, ethyl, propyl, and butyl groups and these alkyl groups may be linear or branched ones and they may have one or a plurality of substituents such as a fluorine atom. The halogen atom is selected from the group consisting of fluorine, chlorine, bromine and iodine atoms.

Specific examples of the foregoing hydrophobic compounds include 1,2-bis(tetramethyldisiloxanyl) ethane, 1,3-bis (trimethylsiloxy)-1,3-dimethyldisiloxane, 1,1,3,3-tetraisopropyldisiloxane, 1,1,3,3-tetraphenyldisiloxane, 1,1,3,3-tetraethyldisiloxane, 1,1,4,4-tetramethyldisiloxane, 1,1,3,3,5,5-hexamethyltrisiloxane, 1,1,3,3,5,5-hexaisopropyltrisiloxane, 1,1,3,3,5,5,7,7-octamethyltetrasiloxane, 1,1,1,3,5,5-hexamethyltrisiloxane, 1,1,1,3,3,5,7,7-octamethyltetrasiloxane, 1,3-dimethyltetramethoxydisiloxane, 1,1,3,3-tetramethyl-1,3-diethoxydisiloxane, 1,1,3,3,5,5-hexamethyldiethoxy-trisiloxane, and tetramethyl-1,3-dimethoxydisiloxane.

The hydrophobic compound, which can be used in the present invention, may also be an organic silicon atom-containing compound having at least one binding unit represented by the formula: Si—X—Si (wherein X represents an oxygen atom, an $NR^3$ group, a $C_nH_{2n}$ group, or a $C_6H_4$ group; $R^3$ represents a $C_mH_{2m+1}$ group, or a $C_6H_5$ group; n is 1 or 2 and m is an integer ranging from 1 to 6) and at least two binding units represented by the formula: Si-A (wherein A represents a hydrogen atom, an OH group, an $OC_bH_{2b+1}$ group, or a halogen atom, provided that a plurality of A present in the same molecule may be the same or different, and b is an integer ranging from 1 to 6). Specific examples thereof include 1,2,3,4,5,6-hexamethylcyclotrisilazane, 1,3,5,7-tetraethyl-2,4,6,8-tetramethylcyclotrisilazane, and 1,2,3-triethyl-2,4,6-triethylcyclotrisilazane.

Further, according to the present invention, cyclosiloxanes can be used as the hydrophobic compounds. The cyclosiloxane is preferably at least one member selected from the group consisting of cyclosiloxane compounds represented by the following general formula:

(Chemical Formula 1)

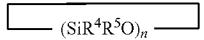

(In the general formula, $R^4$ and $R^5$ may be the same or different from one another and each represent a hydrogen atom, a $C_6H_5$ group, a $C_cH_{2c+1}$ group, a $CF_3(CF_2)_d(CH_2)_e$ group, or a halogen atom; c is an integer ranging from 1 to 3; d is an integer ranging from 0 to 10; e is an integer ranging from 0 to 4; and n is an integer ranging from 3 to 8).

The cyclosiloxane compound represented by the foregoing general formula preferably has at least two Si—H linkages and is preferably one in which at least one of R4 and R5 is a hydrogen atom. If using such a cyclosiloxane, the resulting porous thin film shows an increased hydrophobicity and the dielectric constant thereof is in turn reduced.

Specific examples of such cyclosiloxanes include tri (3,3,3-trifluoropropyl)trimethylcyclotrisiloxane, triphenyltrimethylcyclotrisiloxane, 1,3,5,7-tetramethylcyclotetrasiloxane, octamethylcyclotetrasiloxane, 1,3,5,7-tetramethyl1,3,5,7- tetraphenylcyclotetrasiloxane, 1,3,5,7-tetraethylcyclotetrasiloxane, and pentamethylcyclopentasiloxane. In the precursor composition according to the present invention, these cyclosiloxanes may be used alone or in any combination of at least two of them. Among the foregoing cyclosiloxanes, preferred is 1,3,5,7-tetramethylcyclotetrasiloxane.

The aforementioned cyclosiloxane compounds may likewise be at least one member selected from the group consisting of those represented by the following general formula:

(Chemical Formula 2)

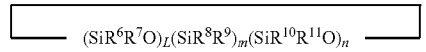

(In the general formula, $R^6, R^7, R^8, R^9, R^{10}$ and $R^{11}$ may be the same or different from one another and each represent a hydrogen atom, a $C_6H_5$ group, a $C_fH_{2f+1}$ group, a $CF_3(CF_2)_g(CH_2)_h$ group, or a halogen atom; f is an integer ranging from 1 to 3; g is an integer ranging from 0 to 10; h is an integer ranging from 0 to 4; L is an integer ranging from 0 to 8; m is an integer ranging from 0 to 8; and n is an integer ranging from 0 to 8, provided that L, m and n should satisfy the following relation: $3 \leq L+m+n \leq 8$; and the compound includes at least two Si—H linkages). Specific examples of such cyclosiloxane compounds include 1,2,3,4,5,6-hexamethylcyclotrisiloxane, 1,3,5,7-tetraethyl-2,4,6,8-tetramethylcyclotetrasiloxane, and 1,2,3-triethyl-2,4,6-triethylcyclotrisiloxane.

Furthermore, among the cyclosiloxanes represented by the foregoing chemical formula 1, those in which either the substituent $R^4$ or the substituent $R^5$ is a hydrogen atom may be, for instance, at least one member selected from the group consisting of cyclosiloxane compounds represented by the following general formula:

(Chemical Formula 3)

(In the formula, R5 is the same as that defined above). Specific examples thereof include, as has been described above, 1,3,5,7-tetramethylcyclotetrasiloxane, 1,3,5,7-tetraethylcyclotetrasiloxane, 1,3,5,7-tetraphenylcyclotetrasiloxane, and pentamethylcyclopentasiloxane. In the present invention, these cyclosiloxanes may be used alone or in any combination of at least two of them.

It is sufficient to use the aforementioned hydrophobic compound in an amount sufficient for forming a polymer film on the inner wall of the pores with respect to the starting porous silica thin film and the amount thereof is, for instance, so controlled that the concentration thereof in the gas phase is not less than 0.1% by volume.

The substrate used in the invention is not restricted to any particular one and specific examples thereof are those prepared from glass, quartz, silicon wafer, and stainless steel. The substrate is not likewise particularly limited in its shape and may have, for instance, a plate-like shape and a dish-like shape.

In the foregoing, the method for applying the precursor composition-containing solution for forming a porous thin film on the substrate surface is not limited to any specific one and specific examples thereof include currently used ones such as the spin-coating technique, the casting technique, and the dipping technique. For instance, the spin-coating technique comprises the steps of placing a substrate on a spinner, and dropping a coating solution onto the substrate surface, while rotating the spinner at a rotational speed ranging from 500 to 10000 rpm.

The present invention permits the production of a porous silica thin film having a low dielectric constant and excellent in the hydrophobicity and therefore, it is not necessary to subjecting the resulting thin film to an additional treatment for converting the same into hydrophobic one after the production of the refined porous silica thin film.

In addition, according to the present invention, the porous silica thin film obtained after the gas-phase reaction is almost free of any non-polymerized residue of the hydrophobic compound. Even if such organic residues are present and when another metal film, a dielectric film or the like are laminated with the resulting refined porous silica thin film, however, the non-polymerized residue would serve to improve the adhesion between these thin film films.

Moreover, in the present invention, the hydrophobic compound can be controlled in such a manner that it can undergo a moderate polymerization reaction by once reducing the pressure of the processing chamber (furnace) to a desired level and then introducing the vapor of the hydrophobic compound into the chamber (furnace), while maintaining the reduced pressure and this accordingly makes it possible to improve the ability of the hydrophobic compound to diffuse into the chamber (furnace) and to uniformize the concentration of the compound within the pores.

In addition, the polymerization reaction can be carried out under reduced pressure and accordingly, the gaseous molecules of the hydrophobic compound can penetrate into the pores of the porous thin film after the preliminary removal of, for instance, gaseous molecules and water molecules originally or accidentally present in the pores thereof and therefore, the ability of the compound to diffuse into the pores is significantly improved. As a result, the present invention thus permits the uniform diffusion of the hydrophobic compound into the pores of the porous thin film within a very short period of time and the initiation of the polymerization reaction and accordingly, the uniform treatment can be ensured even for a large-sized porous thin film.

As has already been discussed above, the refined porous silica thin film according to the present invention is not only excellent in both the dielectric properties and the hydrophobicity, but also excellent in its mechanical strength and therefore, the porous silica thin film can be used as a material for semiconductor devices such as those for interlayer dielectric films and inter-wiring dielectric films; and an optical functional material and an electronic functional material such as a molecular recording medium, a transparent conductive film, a solid electrolyte, an optical waveguide, and a coloring material for LCD (liquid crystal display). In particular, it has been required for the interlayer dielectric films and inter-wiring dielectric films used as semiconductor materials to satisfy the following requirements: for instance, a low dielectric constant; excellent hydrophobicity; and a high mechanical strength, and therefore, it would be quite advantageous to use the refined porous silica thin film according to the present invention, which has a low dielectric constant, excellent hydrophobicity and an excellent mechanical strength.

An example of the production of a semiconductor device which makes use of the refined porous silica thin film according to the present invention as an inter-wiring dielectric film will hereunder be described in more specifically. The semiconductor device can be produced while using the known process conditions for the production of semiconductor devices.

First of all, a refined porous silica thin film is formed on the surface of a substrate as has been described above. The method for the production of the refined porous silica thin film according to the present invention permits the preparation of an inter-wiring dielectric film having not only a low dielectric constant and excellent hydrophobicity, but also an excellent mechanical strength. Then a hard mask and a photoresist are formed on the refined porous silica thin film while using the known process conditions for the production of these films and then the hard mask is etched through the photoresist pattern. After the completion of the etching process, a barrier layer consisting of, for instance, titanium nitride (TiN) or tantalum nitride (TaN) is formed on the refined porous silica thin film according to the chemical vapor deposition technique (CVD).

After the formation of the barrier layer on the surface of the refined porous silica thin film according to the present invention, a copper wiring pattern or a copper electrical connection is formed according to the metal CVD technique, the sputtering technique or the electroplating technique under the known process conditions and then the surface of the resulting film is made smooth by the CMP technique. Subsequently, a capping film is formed on the surface of the film. In addition, if necessary, a hard mask is formed and then the foregoing steps are repeated to thus make a multi-layered structure and to thereby produce the semiconductor device of the present invention.

In this respect, the present invention has been described above, while taking a dielectric film material for semiconductor circuit elements as a preferred embodiment, but the applications of the present invention are not restricted to these specific ones and the present invention can likewise be applied to, for instance, water-proof film electrical materials which require the surface-processing in an aqueous solution, catalytic materials and filter materials.

The present invention will hereunder be described with reference to the following Examples and Reference Examples. The raw materials for the preparation of a precursor composition-containing solution for forming a porous thin film, physical property-measuring devices or the like used in these Examples and Reference Examples are as follows:

Alkoxysilanes: Tetraethoxysilane, dimethyldiethoxysilane (electronic industrial grade, available from YAMANAKA Semiconductor Co., Ltd.);

H2O: Pure water subjected to the de-mineralization treatment and having a resistance value of 18M$\Omega$;

Organic Solvent: Ethanol (electronic industry grade, available from WAKO PURE CHEMICAL INDUSTRIES, Ltd.);

Surfactant: A product obtained by dissolving poly(alkylene oxide) block copolymer: $HO(CH_2CH_2O)_{13}(CH_2CH(CH_3)O)_{20}(CH_2CH_2O)_{13}H$ (Trade name: EPAN, available from Dai-ichi Kogyo Seiyaku, Co., Ltd.) in the foregoing ethanol of the electronic industrial grade and then subjecting it to a de-mineralization treatment;

Additive Element or Additive Element-Containing Compound: A product available from KOJUNDO CHEMICAL Laboratory Co., LTD;

Silylation Agent: 1,3,5,7-Tetramethyl-cyclotetrasiloxane (electronic industrial grade, available from TRICHEMICAL Co., Ltd.);

Film Thickness, Refractive Index: Determined according to the spectroscopic ellipsometry GES5 available from SOPRA SA);

Dielectric Constant: Determined according to the mercury probe-measuring method (SSM2000, available from Solid States Measurements, Inc.);

Mechanical Strength: Determined by measuring the elastic modulus and hardness using a nanoindenter (Nano Indenter DCM, available from MTS Systems Corporation).

REFERENCE EXAMPLE 1

Tetraethoxysilane (TEOS, 0.48 mole), $H_2O$ (1.6 mole), dimethyldiethoxysilane (DMDEOS, 0.0071 mole), and a nonionic surfactant (trade name: P45, average molecular weight: 2300: $OH(CH_2CH_2O)_{13}(CH(CH_3)CH_2O)_{20}(CH_2CH_2O)_{13}H$) (0.1 mole) were stirred together in ethanol at 25° C. for 24 hours under acidic conditions (nitric acid: 0.06 mole) to thus give a transparent and uniform coating solution.

In this respect, the amount of the DMDEOS is not restricted to any specific one. If the DMDEOS is not added, however, there are observed X-ray diffraction peaks ascribed to the presence of the two-dimensional hexagonal arrangement of the pores of the porous thin film obtained after the firing of the thin film and accordingly, it would be difficult to obtain a porous thin film having a Worm-Hole-like pore structure.

The foregoing coating solution was applied onto the surface of a semiconductor Si substrate according to the spin-coating technique at a rotational speed of 1200 rpm and then the coated substrate was fired at 400° C. for one hour in the atmospheric environment. It took 15 minutes to raise the temperature of the substrate up to 400° C. The firing temperature, the time required for raising the temperature and the temperature-holding time are not restricted to specific ones and it is accordingly sufficient to select them in such a manner that they certainly fall within the ranges which never adversely affect the intended properties of the resulting porous thin film.

The porous thin film prepared according to the foregoing procedures was fired within a gaseous atmosphere or the vapor of 1,3,5,7-tetramethylcyclotetrasiloxane (TMCTS) under a pressure of 90 kPa and at a temperature of 400° C. for 30 minutes to thus form a porous silica thin film having a high hydrophobicity and a low dielectric constant. In this case, the vapor of TMCTS was introduced into the processing chamber (furnace) together with an inert gas or N2 gas as a carrier gas, and it was continuously fed thereto throughout the thermal treatment. In this respect, the inner walls of the pores present in the resulting fired porous silica thin film were found to be covered with the poly(methylsiloxane) as the hydrophobic polymeric film. At this stage, the fired thin film was found to have a relative dielectric constant k of 2.147, a refractive index of 1.1844, an elastic modulus of 3.988 GPa and a hardness of 0.45 GPa.

REFERENCE EXAMPLE 2

Coating and thermal treatments were carried out by repeating the same procedures used in Reference Example 1 except for using a coating solution prepared by further adding, to the coating solution used in Reference Example 1, a $Cs(NO_3)/H_2O$ mixture such that the elemental Cs concentration was set at a level of 0.01 to 5000 ppm to thus form a Cs-containing porous thin film. The thin film thus prepared was subjected to the same TMCTS treatment used in Reference Example 1 to thus give a porous silica thin film. The following Table 1 shows the physical properties of the thin film prepared in this Reference Example:

TABLE 1

| Cs Concn. (ppm) | Refractive Index | Relative Dielectric const. | Elastic Modulus (GPa) | Hardness (GPa) |
|---|---|---|---|---|
| 0.01 | 1.202372 | 2.12 | 3.99 | 0.45 |
| 10 | 1.21931 | 1.96 | 4.36 | 0.53 |
| 50 | 1.217728 | 2.08 | 5.72 | 0.67 |
| 100 | 1.23136 | 2.03 | 6.10 | 0.85 |
| 500 | 1.237305 | 2.03 | 7.17 | 1.01 |
| 5000 | 1.253341 | 2.21 | 8.79 | 1.48 |

The data listed in Table 1 indicate that the refractive index and the elastic modulus of the resulting porous thin film are monotonously increase as the increase of the Cs concentration, while the relative dielectric constant thereof is once decreased, but it is increased when the Cs concentration exceeds 5000 ppm since the amount of the TMCTS adhered to the thin film is too large. From the foregoing, when adding the element Cs, the concentration thereof should be controlled to a level of not more than 5000 ppm. On the other hand, if the concentration thereof is less than 0.01 ppm, the relative dielectric constant of the thin film is low, but the elastic modulus and hardness thereof are also low. Accordingly, it would be sufficient that the concentration of the metallic element is in general not less than 0.1 ppm and preferably not less than 1 ppm and not more than 5000 ppm while taking into consideration the elastic modulus and hardness of the resulting porous thin film.

In this connection, FIG. 1 attached hereto shows the cumulative frequency (%) observed when determining the leak current density ($A/cm^2$) of the thin film at a Cs concentration of 10 ppm, while FIG. 2 shows the cumulative frequency (%) observed when determining the dielectric breakdown field [$V_{BD}(MV/cm)$] of the same thin film. In addition, FIGS. 3 and 4 show, respectively, the cumulative frequency (%) observed when determining the leak current density ($A/cm^2$) of the thin film at a Cs concentration of 100 ppm and the cumulative frequency (%) observed when determining the dielectric breakdown field [$V_{BD}(MV/cm)$] of the same thin film. The comparison of the results plotted on FIGS. 1 and 3 or those plotted on FIGS. 2 and 4 indicate that if the Cs concentration is set at 100 ppm, the relative dielectric constant is not affected, but the electrical properties are adversely affected.

In the light of the results obtained in Reference Example 2, it can be recognized that the refractive index, elastic modulus and hardness may serve as indications for the effect of TMCTS to promote the crosslinking through the addition of the element Cs observed in the treatment with the TMCTS, while the relative dielectric constant can never serve as a precise indication therefore. For this reason, the results obtained in Reference Example 3 and Examples and Reference Examples subsequent to the same will be evaluated mainly on the basis of the refractive index, elastic modulus and hardness. In all of Reference Examples, there were observed the improvement of the refractive index, elastic modulus and hardness in proportion to the acceleration of the TMCTS-crosslinking.

REFERENCE EXAMPLE 3

Coating and thermal treatments were carried out by repeating the same procedures used in Reference Example 1 except for using the coating solution prepared in Reference Example 2, in which the Cs(NO$_3$)/H$_2$O mixture used in Reference Example 2 was substituted for a P$_2$O$_5$/EtOH mixture such that the elemental P concentration was equal to 1000 ppm; a Ba(NO$_3$)$_2$/H$_2$O mixture such that the elemental Ba concentration was equal to 1000 ppm; a La$_2$O$_3$/H$_2$O mixture such that the elemental La concentration was equal to 1000 ppm; a Tl(NO$_3$)/H$_2$O mixture such that the elemental Tl concentration was equal to 1000 ppm; a Pb(NO$_3$)$_2$/H$_2$O mixture such that the elemental Pb concentration was equal to 1000 ppm; In (indium) such that the elemental In concentration was equal to 1000 ppm; or a Bi(NO$_3$)$_3$/H$_2$O mixture such that the elemental Bi concentration was equal to 1000 ppm to thus form each corresponding metal-containing porous thin film. The resulting metal-containing porous thin film thus prepared was subjected to the same TMCTS treatment used in Reference Example 1 to thus give each corresponding porous silica thin film. The following Table 2 shows the physical properties (refractive index, relative dielectric constant, elastic modulus and hardness) of the thin film s prepared in this Reference Example:

TABLE 2

| Added Element | Refractive Index | Relative Dielectric const. | Elastic Modulus (GPa) | Hardness (GPa) |
|---|---|---|---|---|
| P | 1.2680 | 3.00 | 9.37 | 0.97 |
| Ba | 1.2215 | 2.05 | 4.72 | 0.57 |
| La | 1.2774 | 3.48 | 9.80 | 1.08 |
| Tl | 1.2100 | 2.15 | 6.36 | 0.73 |
| Pb | 1.2388 | 2.44 | 7.38 | 0.84 |
| In | 1.2188 | 2.65 | 6.72 | 0.69 |
| Bi | 1.1962 | 2.23 | 5.15 | 0.57 |

REFERENCE EXAMPLE 4

Coating and thermal treatments were carried out by repeating the same procedures used in Reference Example 1 except for using the coating solution prepared in Reference Example 2, in which the Cs(NO$_3$)/H$_2$O mixture used in Reference Example 2 was substituted for a Al(NO$_3$)$_3$/Cs(NO$_3$)/H$_2$O mixture such that the ratio: Al/Cs was 1:1 and the concentration of these elements ranged from 0.01 to 5000 ppm in all, to thus form an Al/Cs-containing porous thin film. The resulting metal-containing porous thin film thus prepared was subjected to the same TMCTS treatment used in Reference Example 1 to thus give a porous silica thin film. At this stage, the refractive index, relative dielectric constant, elastic modulus and hardness of the resulting thin film showed tendencies almost identical to those observed for the thin film prepared in Reference Example 2. More specifically, the refractive index, the elastic modulus and the hardness of the resulting porous thin film are monotonously increase as the increase of the metal (Al, Cs) concentration, while the relative dielectric constant thereof is once decreased, but it is increased when the metal concentration exceeds 5000 ppm since the amount of the TMCTS adhered to the thin film is too large. From the foregoing, when adding the metal elements, the concentration thereof should be controlled to a level of not more than 5000 ppm. On the other hand, if the concentration thereof is 0.01 ppm, the relative dielectric constant of the thin film is low, but the elastic modulus and hardness thereof are also low. Accordingly, it would be sufficient that the concentration of the metallic element is in general not less than 0.1 ppm and preferably not less than 1 ppm and not more than 5000 ppm while taking into consideration the behavior of the elastic modulus and hardness of the resulting porous thin film.

REFERENCE EXAMPLE 5

Coating and thermal treatments were carried out by repeating the same procedures used in Reference Example 1 except for using a coating solution prepared by further adding, to the coating solution used in Reference Example 1, a Cs(NO$_3$)/H$_2$O mixture like Reference Example 2 such that the total elemental Cs concentration was set at a level of 10 ppm and that the temperature used in all of the heat treatments was set at 350° C. to thus form a Cs-containing porous thin film. The thin film thus prepared was subjected to the same TMCTS treatment used in Reference Example 1 except that the temperature of the heat treatment was set at 350° C. to thus give a porous silica thin film. At this stage, the resulting thin film was found to have a refractive index of 1.2234, a relative dielectric constant of 2.15, an elastic modulus of 4.77 GPa, and a hardness of 0.66 GPa. Regarding the Cs-containing porous silica thin film, there were observed the improvement of the refractive index and the mechanical strength when the use of the metal element was combined with the TMCTS treatment, as compared with the thin film free of any metal Cs prepared in Reference Example 1, although the temperature of the heat treatment was reduced from 400° C. to 350° C.

REFERENCE EXAMPLE 6

Coating and thermal treatments were carried out by repeating the same procedures used in Reference Example 1 except that urea/H$_2$O aqueous solution was further added to the coating solution prepared in Reference Example 1 in such a manner that the molar ratio: urea/Si fell within the range of from 0 to 4, to thus form a porous thin film.

The resulting porous thin film was irradiated with ultraviolet rays having a wavelength of 172 nm over a time period ranging from 5 to 20 minutes, at a temperature of 350° C. and under a pressure of about 1 Pa in a nitrogen gas atmosphere, then fired in the vapor of 1,3,5,7-tetramethylcyclotetrasiloxane (TMCTS) under a pressure of 90 kPa and at a temperature of 400° C. for 30 minutes to thus give a porous silica thin film. In this case, the vapor of TMCTS was introduced into the processing chamber (furnace) together with an inert gas or N2 gas as a carrier gas, and it was continuously fed thereto throughout the thermal treatment. In this respect, the inner walls of the pores present in the resulting fired porous silica thin film having a high hydrophobicity and a low dielectric constant were found to be covered with the poly(methylsiloxane) as the hydrophobic polymeric film.

The TMCTS-treated thin film prepared by the foregoing procedures and a thin film free of any TMCTS-treatment were inspected for the refractive index, film thickness, and relative dielectric constant and the results thus obtained are summarized in the following Table 3:

TABLE 3

| Urea/Si | TMCTS Treatment | Refractive Index | Film Thickness (nm) | Relative Dielectric Const. |
|---|---|---|---|---|
| 0 | No | 1.202 | 214 | — |
|   | Yes | 1.287 | 211 | — |
| 0.25 | No | 1.241 | 196 | — |
|   | Yes | 1.343 | 193 | — |
|   | Yes | 1.230 | 116 | 2.46 |

TABLE 3-continued

| Urea/Si | TMCTS Treatment | Refractive Index | Film Thickness (nm) | Relative Dielectric Const. |
|---|---|---|---|---|
| 0.5 | No | 1.264 | 182 | — |
|  | Yes | 1.300 | 180 | — |
| 0.75 | No | 1.283 | 177 | — |
|  | Yes | 1.332 | 175 | — |
|  | Yes | 1.245 | 116 | 2.64 |
| 0 | No | 1.173 | 237 | — |
| 1 | No | 1.250 | 190 | — |
| 2 | No | 1.266 | 177 | — |
| 3 | No | 1.265 | 177 | — |
| 4 | No | 1.265 | 174 | — |

As will be clear from the data listed in Table 3, the refractive index and the relative dielectric constant of the porous thin film are increased depending on the ratio: urea/Si.

EXAMPLE 1

Tetraethoxysilane (TEOS, 0.48 mole), $H_2O$ (1.6 mole), dimethyldiethoxysilane (DMDEOS, 0.0071 mole), and a nonionic surfactant (trade name: P45, average molecular weight: 2300, $OH(CH_2CH_2O)_{13}(CH(CH_3)CH_2O)_{20}(CH_2CH_2O)_{13}H$) (0.1 mole) were stirred in ethanol at 25° C. for 24 hours under acidic conditions (nitric acid: 0.06 mole) to thus give a transparent and uniform solution. In this respect, if the DMDEOS is not added, it would be difficult to obtain a porous thin film having a Worm-Hole-like pore structure.

To the resulting solution, there were added a $Cs(NO_3)/H_2O$ mixture such that the elemental Cs concentration was equal to 100 ppm and urea in an amount ranging from 0 to 0.25 mole as expressed in terms of the elemental ratio relative to Si to thus form a coating solution.

The resulting coating solution was applied onto the surface of a semiconductor Si substrate according to the spin-coating technique at a rotational speed of 1200 rpm and then the coated substrate was dried and fired at a temperature of 400° C. for one hour in the atmospheric environment to thus give a porous thin film. It took 15 minutes to raise the temperature of the substrate up to 400° C. The firing temperature, the time required for raising the temperature and the temperature-holding time are not restricted to specific ones and it is accordingly sufficient to select them in such a manner that they certainly fall within the ranges which never adversely affect the intended properties of the resulting porous thin film.

The porous thin film thus prepared was irradiated with ultraviolet rays having a wavelength of 172 nm over a time period ranging from 5 to 20 minutes, at a temperature of 350° C. and under a pressure of about 1 Pa in a nitrogen gas atmosphere, then fired in the vapor of 1,3,5,7-tetramethylcyclotetrasiloxane (TMCTS) under a pressure of 90 kPa and at a temperature of 400° C. for 30 minutes to thus give a porous silica thin film. In this case, the vapor of TMCTS was introduced into the processing chamber (furnace) together with an inert gas or N2 gas as a carrier gas, and it was continuously fed thereto throughout the thermal treatment. In this respect, the inner walls of the pores present in the resulting fired porous silica thin film having a high hydrophobicity and a low dielectric constant were found to be covered with the poly(methylsiloxane) as the hydrophobic polymeric film.

The TMCTS-treated thin film prepared in this Example and a thin film free of any TMCTS-treatment were inspected for the refractive index, film thickness, relative dielectric constant, elastic modulus and hardness and the results thus obtained are summarized in the following Table 4:

TABLE 4

| (Cs Concentration = 100 ppm) | | | | | |
|---|---|---|---|---|---|
| Urea/Si | TMCTS Treatment | Refractive Index | Film Thickness (nm) | R.D. Const. *1 | Elastic Modulus (GPa) | Hardness (GPa) |
| 0 | No | 1.1814 | 217 |  | 2.27 | 0.27 |
|  | Yes | 1.2197 | 212 | 1.99 | 3.30 | 0.47 |
| 0.06 | No | 1.2238 | 176 |  | 4.23 | 0.44 |
|  | Yes | 1.2663 | 174 | 2.25 | 6.82 | 0.89 |
| 0.13 | No | 1.2299 | 175 |  | 5.04 | 0.54 |
|  | Yes | 1.2954 | 173 | 2.45 | 9.38 | 1.23 |
| 0.25 | No | 1.2332 | 165 |  | 5.14 | 0.56 |
|  | Yes | 1.2988 | 164 | 2.49 | 9.40 | 1.35 |

*1: R.D. Const.: Relative dielectric constant.

As will be seen from the data listed in Table 4, the mechanical strength of the resulting porous thin film was increased depending on the ratio: urea/Si and it is also clear that the relative dielectric constant also increases. To obtain a desired thin film having a relative dielectric constant of not more than 2.4 and the elastic modulus of not less than 9 GPa, the molar ratio: Compound (E) (such as urea)/Si should range from about 0.03 to 0.13, and further to obtain a thin film having a relative dielectric constant of not more than 2.3, the molar ratio: Compound (E)/Si should range from about 0.03 to 0.06.

EXAMPLE 2

Coating and thermal treatments were carried out by repeating the same procedures used in Example 1, except for using a coating solution prepared by adding, instead of the coating solution used in Example 1, a $Cs(NO_3)/H_2O$ mixture such that the total elemental Cs concentration was set at a level of 100 ppm and further urea such that the amount thereof was equal to 0.06 mole as expressed in terms of the elemental ratio: urea/Si to thus form a porous thin film. The resulting thin film was irradiated with ultraviolet rays and then subjected to a TMCTS treatment using the same methods used in Example 1 to thus give a porous silica thin film. FIGS. 5 and 6 show, respectively, the cumulative frequency (%) observed for the thin film prepared in this Example when determining the electrical properties (leak current density $(A/cm^2)$) thereof and the cumulative frequency (%) observed for the same thin film when determining the dielectric breakdown field $[V_{BD}(MV/cm)]$ thereof. As will be clear from the comparison of the data plotted on these figures with those plotted on FIGS. 3 and 4 relating to the thin film prepared in Reference Example 2, the addition of urea would permit the improvement of the electrical properties of the porous thin film even if the Cs concentration is identical to one another.

EXAMPLE 3

In this Example, the same procedures used in Example 1 were repeated except that the amount of the surfactant was reduced to ¼ time that used in Example 1, that the $Cs(NO_3)/H_2O$ mixture was added such that the elemental Cs concentration was set at a level of 15 ppm and that urea was added such that the amount thereof was equal to 0.03 mole as expressed in terms of the elemental ratio: urea/Si to thus prepare and use a coating solution. The resulting coating solution was applied onto the surface of a semiconductor Si substrate according to the spin-coating technique at a rotational speed of 1600 rpm and then (1) the coated substrate was fired at a temperature of 350° C. for one hour in a nitrogen gas atmosphere. In this case, it took 50 minutes to raise the temperature of the substrate up to 350° C., this temperature (350° C.) was maintained for 60 minutes, then the temperature of the substrate was reduced to room temperature and the substrate was withdrawn from the processing chamber (furnace). (2) The substrate withdrawn from the processing chamber (furnace) was irradiated with ultraviolet rays having a wavelength of 172 nm over a time period ranging from 5 to 20 minutes, at a temperature of 350° C. and under a pressure of about 1 Pa in a nitrogen gas atmosphere and then the temperature was reduced and the substrate was removed. Further, (3) the substrate thus irradiated with ultraviolet rays was heated up to 350° C. in a nitrogen gas atmosphere, then fired in the vapor of tetramethylcyclotetrasiloxane (TMCTS) under a pressure of 30 kPa and at a temperature of 350° C. for 90 minutes to thus give a porous silica thin film having a high hydrophobicity and a low dielectric constant and the thin film was inspected for the physical properties. Separately, the foregoing processes (2) to (3) were repeated twice using the thin film obtained above to give another thin film sample and this sample was likewise inspected for the physical properties. The physical properties thus obtained are summarized in the following Table 5:

TABLE 5

| No. of Repetition | Cs Concn. | Urea/Si | UV (min) | UV (J/cm$^2$) |
|---|---|---|---|---|
| 1 | 15 | 0.03 | 20 | 1.68 |
| 1 | 15 | 0.03 | 10 | 0.84 |
| 1 | 15 | 0.03 | 5 | 0.42 |
| 2 | 15 | 0.03 | 10 | 0.84 |
| 2 | 15 | 0.03 | 60 | 5.04 |

| No. of Repetition | Film Thickness (nm) | Refractive Index | R.D. Const. *1 | Elastic Modulus (GPa) | Hardness (GPa) |
|---|---|---|---|---|---|
| 1 | 197.45 | 1.27742 | 2.11 | 6.10 | 0.80 |
| 1 | 204.39 | 1.26290 | 2.06 | 5.32 | 0.67 |
| 1 | 207.66 | 1.25780 | 2.04 | 5.09 | 0.65 |
| 2 | 211.39 | 1.24801 | 2.20 | 7.95 | 0.87 |
| 2 | 154.62 | 1.26641 | 2.46 | 11.05 | 1.21 |

*1: R.D. Const.: Relative dielectric constant.

As will be seen from the data listed in Table 5, the foregoing method would permit the production of a porous thin film having a sufficiently low relative dielectric constant and a high mechanical strength even if the firing thereof is carried out at 350° C. in a non-oxidizing atmosphere.

EXAMPLE 4

Coating and thermal treatments were carried out by repeating the same procedures used in Example 1, except for using the metallic element-containing coating solution used in Reference Example 3 instead of the coating solution used in Example 1 having a Cs concentration of 100 ppm and except that urea was further added to the solution such that the amount thereof was equal to 0.06 mole as expressed in terms of the elemental ratio: urea/Si to thus form a porous thin film. The resulting porous thin film was irradiated with ultraviolet rays and then subjected to a TMCTS treatment according to the same methods used in Example 1 to thus give a porous silica thin film. The thin film thus obtained was found to be improved in its electrical properties (leak current density (A/cm$^2$) and dielectric breakdown field ($V_{BD}$(MV/cm))).

Industrial Applicability

The present invention can provide a porous silica thin film not only having a low dielectric constant and a low refractive index, but also showing excellent mechanical strength and improved hardness and accordingly, this porous thin film can be used as a dielectric thin film having a low relative dielectric constant in the field of the semiconductor and a thin film having a low refractive index in the field of, for instance, display.

Figure 1:
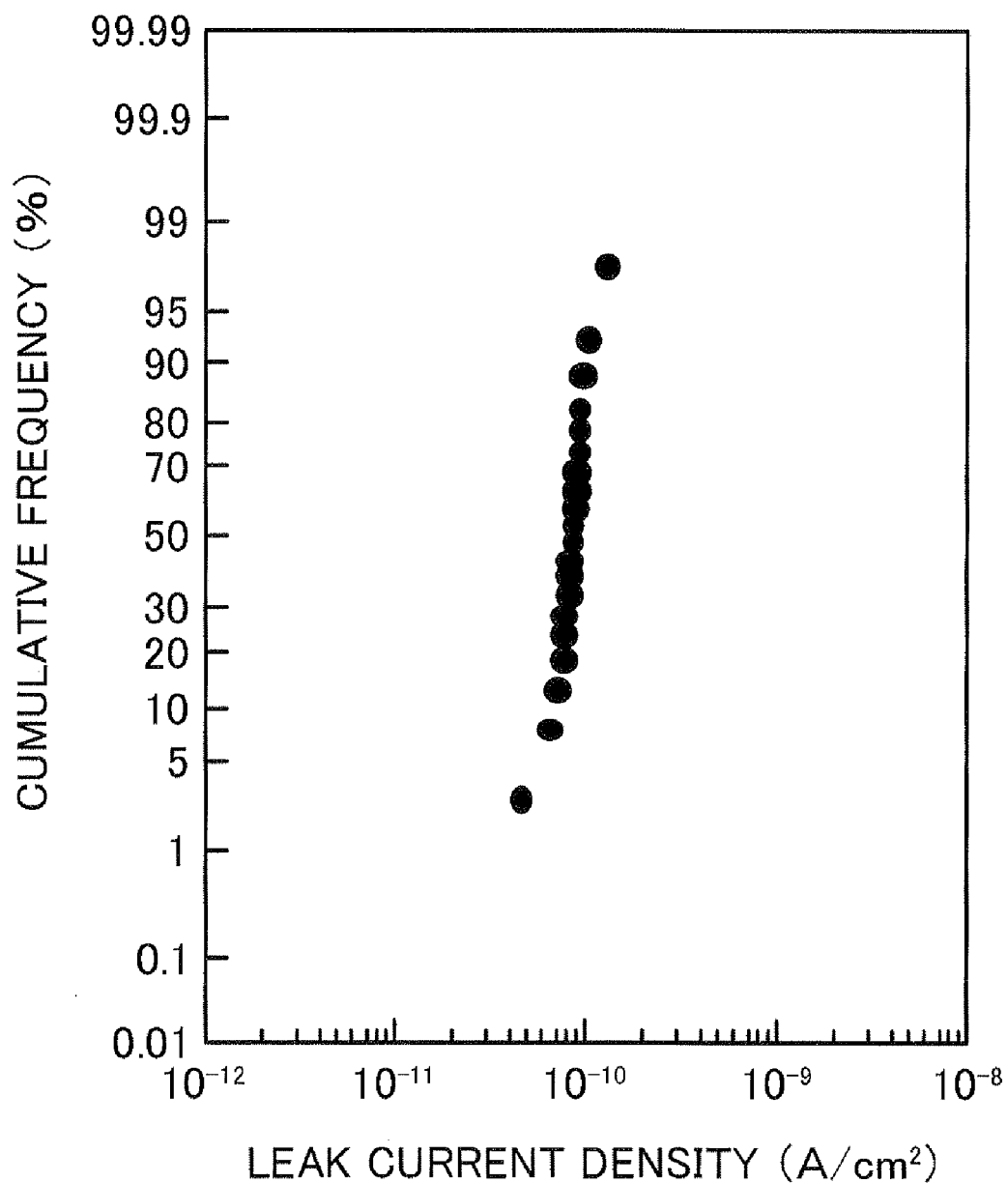
FIG. 1 is a graph illustrating the relation between the leak current density (A/cm$^2$) and the cumulative frequency (%), observed for the porous thin film containing 10 ppm of Cs prepared in Reference Example 2.
Figure 2:
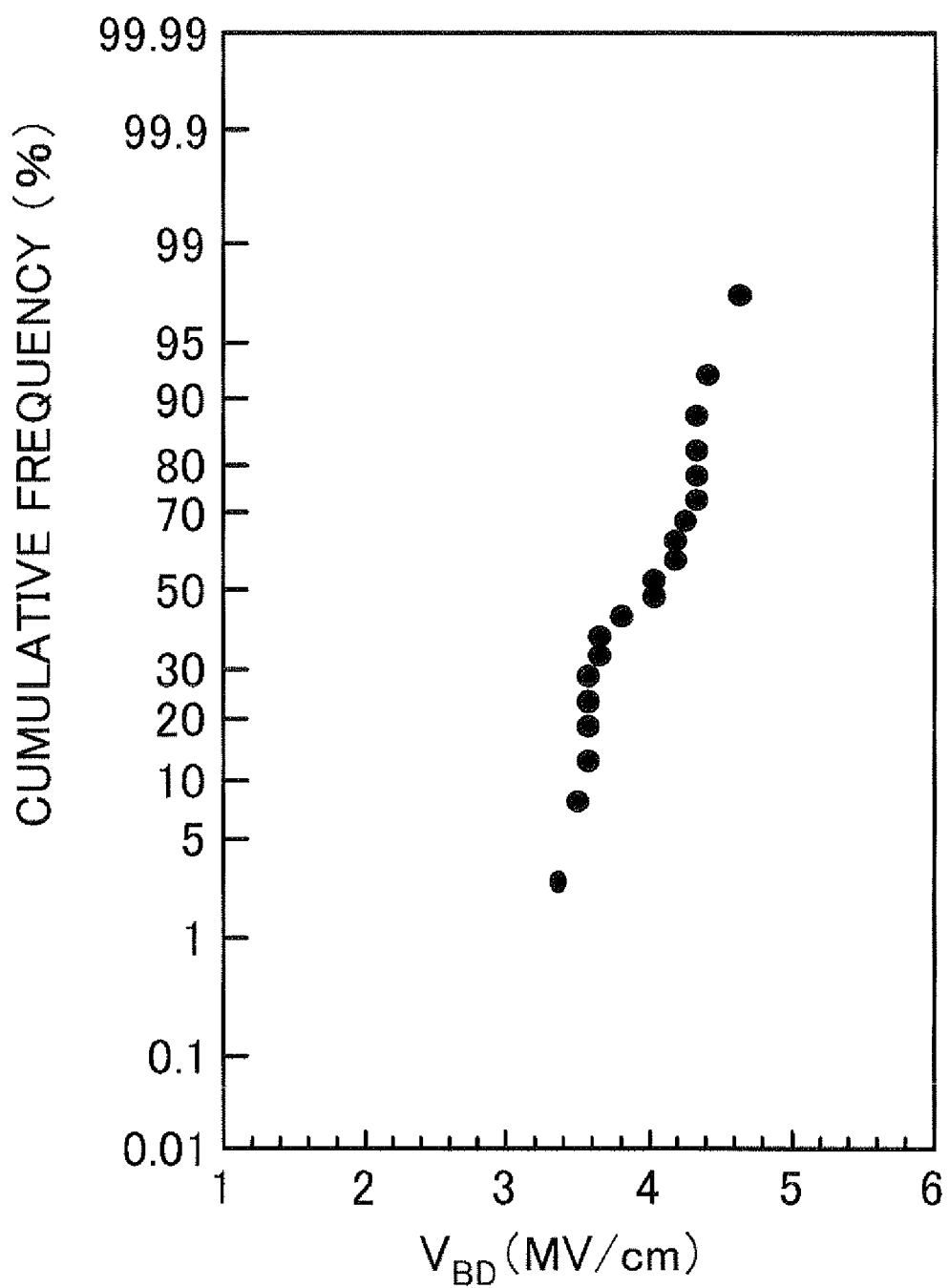
FIG. 2 is a graph illustrating the relation between the dielectric breakdown field ($V_{BD}$(MV/cm)) and the cumulative frequency (%) observed for the porous thin film containing 10 ppm of Cs prepared in Reference Example 2.
Figure 3:
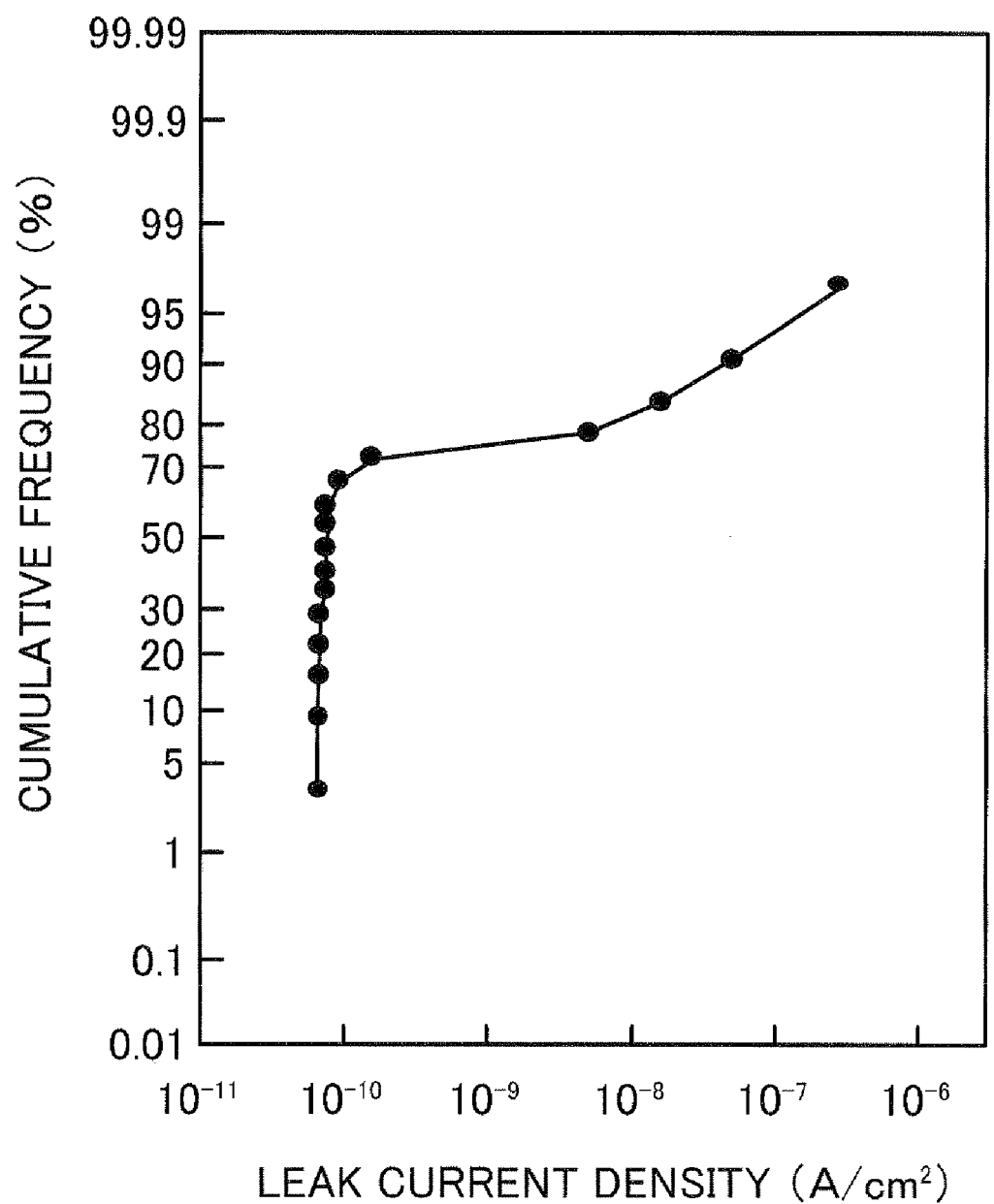
FIG. 3 is a graph illustrating the relation between the leak current density (A/cm$^2$) and the cumulative frequency (%), observed for the porous thin film containing 100 ppm of Cs prepared in Reference Example 2.
Figure 4:
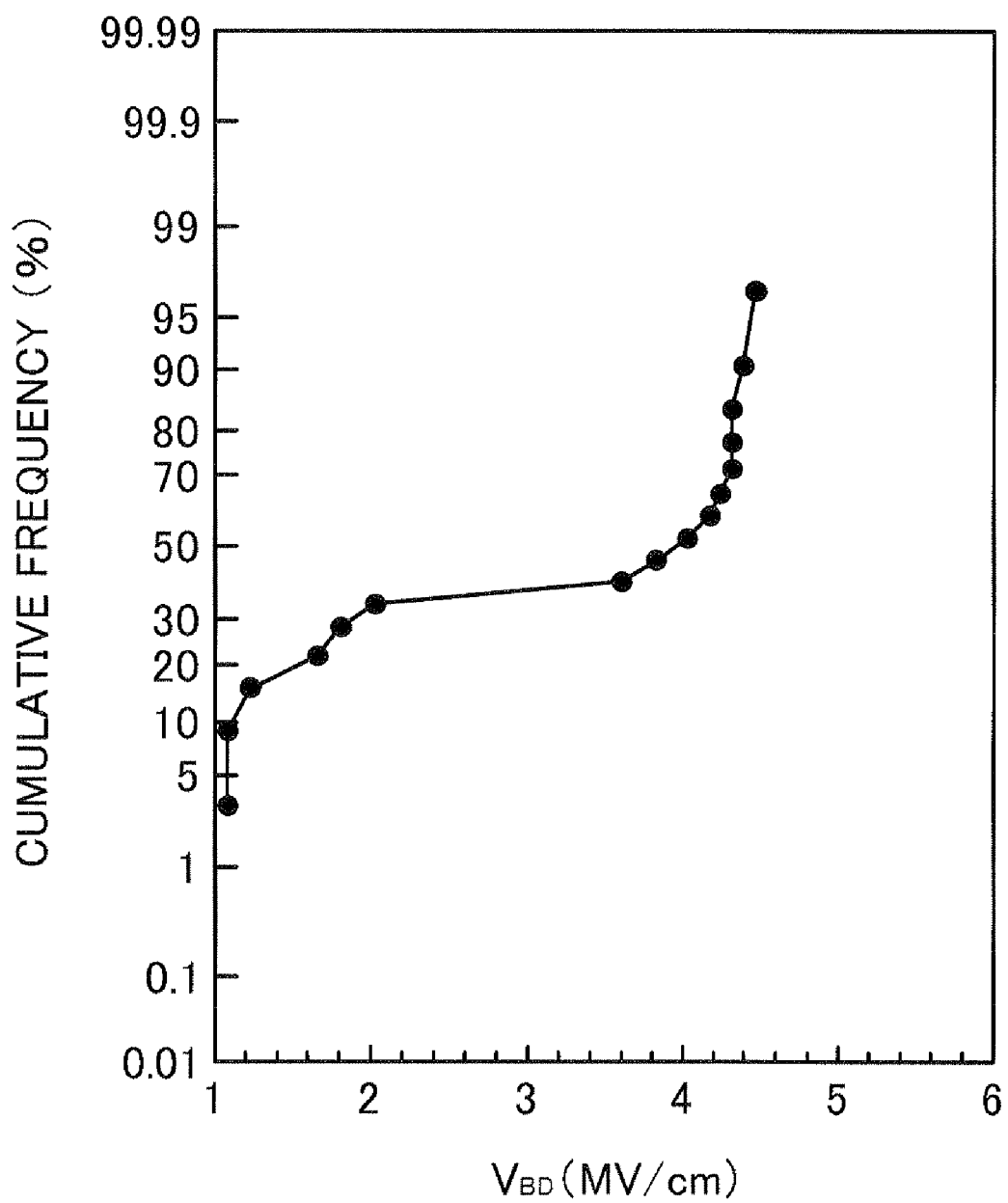
FIG. 4 is a graph illustrating the relation between the dielectric breakdown field ($V_{BD}$(MV/cm)) and the cumulative frequency (%), observed for the porous thin film containing 100 ppm of Cs prepared in Reference Example 2.
Figure 5:
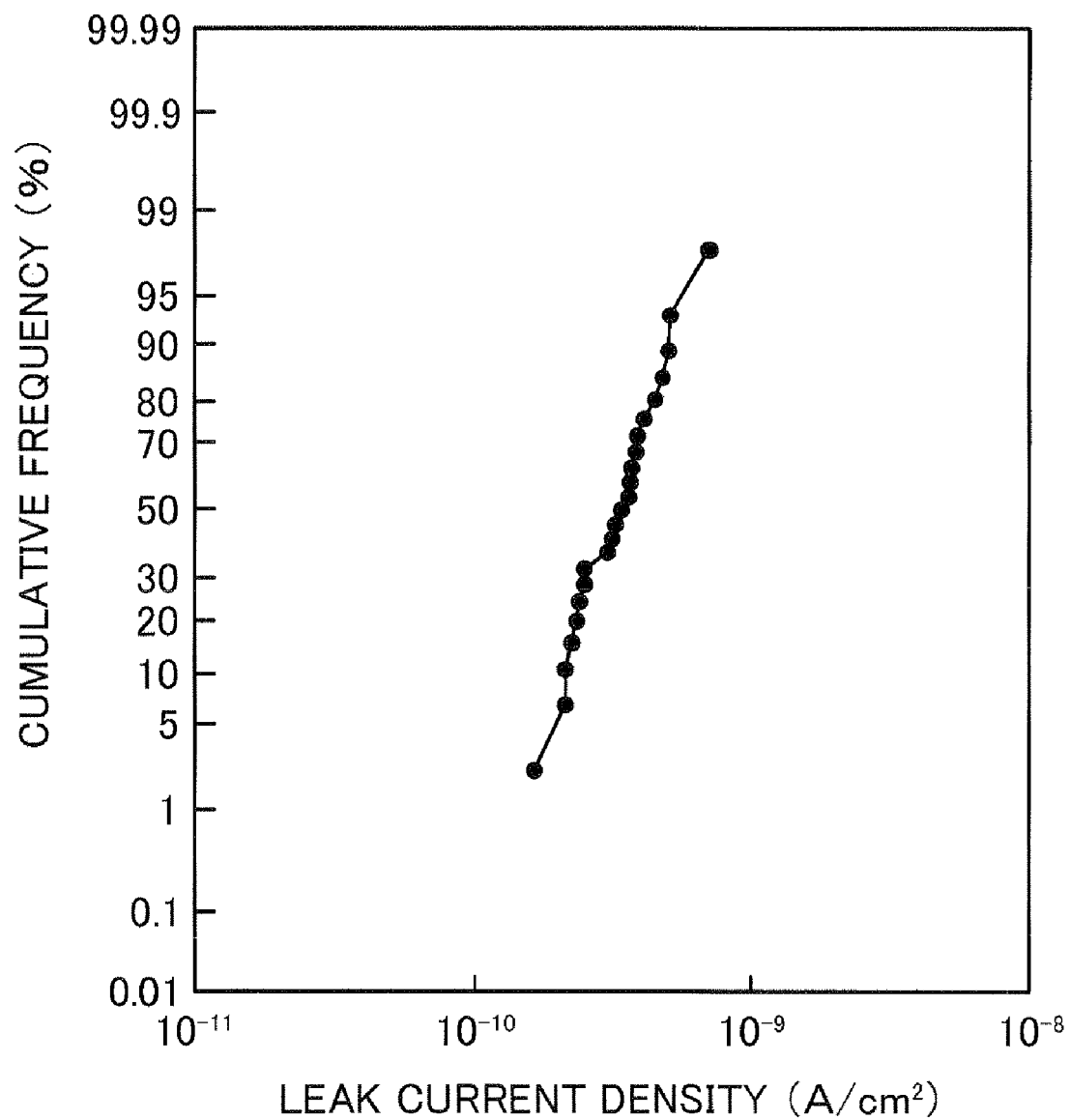
FIG. 5 is a graph illustrating the relation between the leak current density (A/cm$^2$) and the cumulative frequency (%), observed for the porous thin film containing urea in an amount of 0.06 mole as expressed in terms of the elemental ratio: urea/Si and prepared in Example 3.
Figure 6:
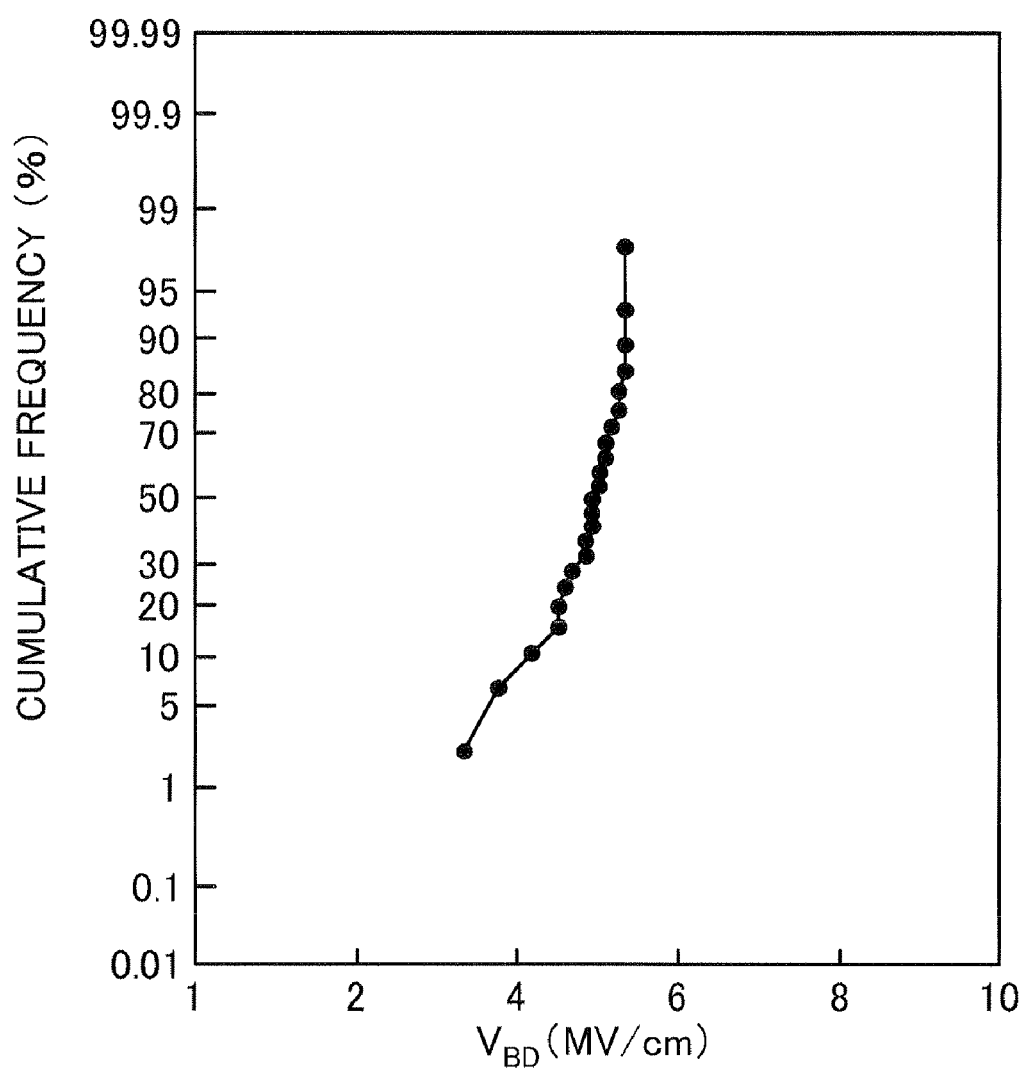
FIG. 6 is a graph illustrating the relation between the dielectric breakdown field ($V_{BD}$) and the cumulative frequency (%), observed for the porous thin film containing urea in an amount of 0.06 mole as expressed in terms of the elemental ratio: urea/Si and prepared in Example 3.

What is claimed is:

1. A method for the preparation of a porous thin film comprising the steps of:
applying, onto a surface of a substrate, a solution of a precursor composition for forming a porous thin film prepared by blending, in an organic solvent, at least one member selected from the group consisting of compounds (A) represented by the following general formula (1) and compounds (B) represented by the following general formula (2):

$$Si(OR^1)_4 \qquad (1)$$

$$R_a(Si)(OR^2)_{4-a} \qquad (2)$$

wherein in the foregoing formulas (1) and (2), $R^1$ represents a monovalent organic group; R represents a hydrogen atom, a fluorine atom or a monovalent organic group; $R^2$ represents a monovalent organic group; and a is an integer ranging from 1 to 3, provided that R, $R^1$ and $R^2$ may be the same or different from one another; a heat decomposable organic compound (C) which undergoes heat decomposition at a temperature of not less than 250° C.; and at least one component (D) which is at least one element selected from the group consisting of amphoteric elements having an electronegativity of not higher than 2.5, elements having an ionic radius of not less than 1.6 Å and elements having an atomic weight of not less than 130, or is at least one compound containing at least one element selected from the group consisting of amphoteric elements having an electronegativity of not higher than 2.5, elements having an ionic radius of not less than 1.6 Å and elements having an atomic weight of not less than 130; and then mixing the resulting mixed solution with a compound (E) which is thermally decomposed at a temperature ranging from 90 to 200° C. and can generate an amine through the thermal decomposition and whose aqueous solution and/or solution in an alcohol/water mixed solvent have a pH value falling within the range of from 6.5 to 8, at a temperature of not higher than the heat-decomposition temperature thereof;

drying a resulting coated layer of the solution by heating the same at a temperature ranging from 100 to 400° C.;

irradiating a porous thin film formed on the substrate surface with ultraviolet rays having a wavelength ranging from 157 to 344 nm; and then;

reacting the porous thin film with a hydrophobic compound having a hydrophobic group and at least one group selected from polymerizable groups through a gas-phase reaction carried out at a temperature ranging from 100 to 600° C. to thus form a hydrophobic porous thin film.

2. The method for the preparation of a porous thin film as set forth in claim 1, wherein the hydrophobic compound is a compound which has at least one hydrophobic group selected from alkyl groups each having 1 to 6 carbon atoms and $C_6H_5$ group and at least one polymerizable group selected from a hydrogen atom, an OH group and a halogen atom.

3. The method for the preparation of a porous thin film as set forth in claim 1, wherein the hydrophobic compound is an organic silicon atom-containing compound having at least one kind of binding unit represented by the formula: Si—X—Si (wherein X represents an oxygen atom, an $NR^3$ group, a $C_nH_{2n}$ group or a $C_6H_4$ group, $R^3$ represents a $C_mH_{2m+1}$ group or a $C_6H_5$ group, n is 1 or 2 and m is an integer ranging from 1 to 6) and at least two kinds of binding units represented by the formula: Si-A (wherein A represents a hydrogen atom, an OH group, a $OC_bH_{2b+1}$ group or a halogen atom, provided that a plurality of substituents A present in the same molecule may be the same or different, and b is an integer ranging from 1 to 6).

4. A method for the preparation of a porous thin film comprising the step of repeating the method as set forth in claim 1 to thus form a porous thin film having an improved mechanical strength.

5. A porous thin film prepared according to the method as set forth in claim 1.

6. A semiconductor device produced using a porous thin film prepared according to the method as set forth in claim 1.

* * * * *